(12) United States Patent  
Henley et al.

(10) Patent No.: US 8,133,800 B2  
(45) Date of Patent: Mar. 13, 2012

(54) FREE-STANDING THICKNESS OF SINGLE CRYSTAL MATERIAL AND METHOD HAVING CARRIER LIFETIMES

(75) Inventors: Francois J. Henley, Aptos, CA (US); Sien Kang, Dublin, CA (US); Zuqin Liu, Palo Alto, CA (US); Lu Tian, Milpitas, CA (US)

(73) Assignee: Silicon Genesis Corporation, San Jose, CA (US)

( * ) Notice: Subject to any disclaimer, the term of this patent is extended or adjusted under 35 U.S.C. 154(b) by 182 days.

(21) Appl. No.: 12/460,899

(22) Filed: Jul. 23, 2009

(65) Prior Publication Data

US 2010/0052105 A1 Mar. 4, 2010

Related U.S. Application Data

(60) Provisional application No. 61/093,248, filed on Aug. 29, 2008.

(51) Int. Cl.  
*H01L 21/30* (2006.01)  
*H01L 21/46* (2006.01)

(52) U.S. Cl. ......... 438/458; 438/691; 438/705; 257/617

(58) Field of Classification Search .................. 438/458, 438/691, 705; 257/617  
See application file for complete search history.

(56) References Cited

U.S. PATENT DOCUMENTS

2010/0025804 A1* 2/2010 Kawai et al. .................. 257/506  
2011/0111575 A1* 5/2011 Akiyama et al. .............. 438/458

* cited by examiner

*Primary Examiner* — Phat Cao  
(74) *Attorney, Agent, or Firm* — Kilpatrick, Townsend & Stockton LLP

(57) ABSTRACT

A method of fabricating a thickness of silicon material includes providing a silicon ingot material having a surface region and introducing a plurality of particles having an energy of about 1-5 MeV through the surface region to a depth to define a cleave region and a thickness of detachable material between the cleave region and the surface region. Additionally, the method includes processing the silicon ingot material to free the thickness of detachable material at a vicinity of the cleave region and causing formation of a free-standing thickness of material characterized by a carrier lifetime about 10 microseconds and a thickness ranging from about 20 microns to about 150 microns with a thickness variation of less than about five percent. Furthermore, the method includes treating the free-standing thickness of material using a thermal treatment process to recover the carrier lifetime to about 200 microseconds and greater.

21 Claims, 18 Drawing Sheets

FREE-STANDING THICKNESS OF SINGLE CRYSTAL MATERIAL AND METHOD HAVING CARRIER LIFETIMES

CROSS-REFERENCE TO RELATED APPLICATION

The instant nonprovisional patent application claims priority to U.S. provisional patent application No. 61/093,248 filed on Aug. 29, 2009 and incorporated by reference in its entirety herein for all purposes.

BACKGROUND OF THE INVENTION

The present invention relates generally to technique including a method and a structure for forming a solar cell structure using layer transfer techniques for photovoltaic applications. But it will be recognized that the invention has a wider range of applicability; it can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, biological and biomedical devices, and the like.

From the beginning of time, human beings have relied upon the "sun" to derive almost all useful forms of energy. Such energy comes from petroleum, radiant, wood, and various forms of thermal energy. As merely an example, human being have relied heavily upon petroleum sources such as coal and gas for much of their needs. Unfortunately, such petroleum sources have become depleted and have led to other problems. As a replacement, in part, solar energy has been proposed to reduce our reliance on petroleum sources. As merely an example, solar energy can be derived from "solar cells" commonly made of silicon.

The silicon solar cell generates electrical power when exposed to solar radiation from the sun. The radiation interacts with atoms of the silicon and forms electrons and holes that migrate to p-doped and n-doped regions in the silicon body and create voltage differentials and an electric current between the doped regions. Depending upon the application, solar cells have been integrated with concentrating elements to improve efficiency. As an example, solar radiation accumulates and focuses using concentrating elements that direct such radiation to one or more portions of active photovoltaic materials. Although effective, these solar cells still have many limitations.

As merely an example, solar cells rely upon starting materials such as silicon. Such silicon is often made using either polysilicon (sometimes referred as multicrystalline silicon) and/or single crystal silicon materials. These materials are often difficult to manufacture. Polysilicon cells are often formed by manufacturing polysilicon plates. Although these plates may be formed effectively, they do not possess optimum properties for highly effective solar cells. Single crystal silicon has suitable properties for high grade solar cells. Such single crystal silicon is, however, expensive and is also difficult to use for solar applications in an efficient and cost effective manner. Generally, thin-film solar cells are less expensive by using less silicon material but their amorphous or polycrystal structure are less efficient than the more expensive bulk silicon cells made from single-crystal silicon substrates. Certain techniques have attempted to use thin films of single crystal silicon, but were generally unsuccessful. That is, such techniques often use mechanical devices, such as wire saws, polishers, and grinders, which often introduce defects into the thin silicon films. Attempting to overcome all or some of these and other limitations, solar cell industry would like to have improved manufacture techniques of free-standing single crystal silicon materials with relative thin thickness (10-150 µm) and high carrier life time to make photovoltaic cell with efficiency exceeding 20%.

From the above, it is seen that a technique for manufacturing large substrates which is cost effective and efficient is desirable.

BRIEF SUMMARY OF THE INVENTION

According to the present invention, techniques directed to the manufacture of photovoltaic materials are provided. More particularly, the invention provides a technique including a method and a structure for forming a solar cell using layer transfer techniques for photovoltaic applications. But it will be recognized that the invention has a wider range of applicability; it can also be applied to other types of applications such as for three-dimensional packaging of integrated semiconductor devices, photonic devices, piezoelectronic devices, flat panel displays, MEMS, nano-technology structures, sensors, actuators, integrated circuits, biological and biomedical devices, and the like.

In a specific embodiment, the present invention provides a method of fabricating a thickness of silicon material. The method includes providing a silicon ingot material having a surface region. The method further includes introducing a plurality of particles having an energy of about 1-5 MeV and greater through the surface region to a depth to define a cleave region and a thickness of detachable material between the cleave region and the surface region. Additionally, the method includes processing the silicon ingot material to free the thickness of detachable material at a vicinity of the cleave region. The method further includes causing formation of a free-standing thickness of material characterized by a carrier lifetime of about 10 microseconds and less, a first thickness ranging from about 20 microns to about 150 microns with a thickness variation of less than about one percent. Furthermore, the method includes treating the free-standing thickness of material using an etching process. Moreover, the method includes performing a thermal treatment process on the free-standing thickness of material to recover the carrier lifetime to greater than about 200 microseconds.

In another specific embodiment, the present invention provides a method of fabricating a thickness of silicon material having a total thickness variation of less than about 5% (change in thickness/thickness). The method includes providing a silicon ingot material having a surface region and introducing a plurality of particles having an energy of about 1-5 MeV and greater through the surface region to a depth to define a cleave region and a thickness of detachable material between the cleave region and the surface region. Additionally, the method includes processing the silicon ingot material to free the thickness of detachable material at a vicinity of the cleave region. The method further includes causing formation of a free-standing thickness of material characterized by a carrier lifetime of about 10 microseconds and less, a first thickness substantially equal to that of the thickness of detachable material with a first thickness variation of less than about one percent. Furthermore the method includes treating the free-standing thickness of material using an etching process and performing a thermal treatment process on the free-standing thickness of material to recover the carrier lifetime to greater than about 200 microseconds. Moreover, the method includes fabricating the free-standing thickness of material having a stress to fracture (sometimes referred as "mechanical strength") ranging from about 1 GPa and greater in fracture stress.

In another specific embodiment, the method includes processing the silicon ingot material to detach the materials by external energy including delivering energy by beam such as proton, laser, electron beam as well as non-beam including ultrasonic transducer, induction heating, and mechanical approach or the like. The method includes the theory development on detach the materials from tiles with the thickness ranging from 20-150 μm. The method also includes the theory explanation to high lifetime recovery process. The method further includes thin layer material characteristic method including surface roughness, bow, total thickness variation (TTV), mechanical strength. Furthermore the methods including thin material handling during all the process flow.

In an alternative embodiment, the present invention provides a thickness of silicon material having a total thickness variation of less than about 5% (change in thickness/thickness). Additionally, what the invention provides is a free-standing thickness of P-type single crystal silicon material having a thickness ranging from about 20 microns to about 150 microns. What the invention provides further includes a first surface region overlying the free-standing thickness of single crystal silicon material and a second surface region overlying the free-standing thickness of single crystal silicon material. Furthermore the free-standing thickness of single crystal silicon material includes a total thickness variation of less than about one percent from a first edge region of the free-standing thickness of single crystal silicon material to a second edge region of the free-standing thickness of single crystal silicon material. Moreover, the free-standing thickness of single crystal silicon material includes a carrier lifetime to greater than about 200 microseconds and a strength of about 1 GPa and greater in fracture stress. The material doping concentration and type to achieve a desired resistivity is a function of the specific photovoltaic cell design and can be either P-type or N-type. Typical resistivities range from 0.1 ohm-cm to over 20 ohm-cm. If no dopants are introduced into the starting material, the resistivity is deemed intrinsic and can be very high. P-type material is sometimes used in this invention as merely an example and should not be limiting.

Depending upon embodiments, one or more of benefits may be achieved, including providing a method of fabricating a thickness of single crystal silicon material with thickness less than 150 microns, a method of consistently manufacturing a plurality of such thickness of silicon material with a thickness variation less than 5%, and a method of making such the thickness of silicon material with a minority carrier lifetime of about 200 microseconds and greater. The free-standing thickness of silicon materials made from certain embodiments of the present invention provide base material for making high efficiency solar cell. For example, energy conversion rate of 20% or higher can be achieved using the of thickness of silicon material having a total thickness variation of less than about 5% and carrier lifetime greater than 200 microseconds. These and other benefits may be described throughout the present specification and more particularly below.

DETAILED DESCRIPTION OF THE INVENTION

Embodiments of the present invention relate generally to techniques including a method and a structure for forming a solar cell structure using layer transfer techniques for photovoltaic applications. But it will be recognized that the invention has a wider range of applicability; it can also be applied to other types of applications such as for three-dimensional packaging of integrated semiconductor devices, photonic devices, piezoelectronic devices, flat panel displays, MEMS, nano-technology structures, sensors, actuators, integrated circuits, biological and biomedical devices, and the like.

Figure 1:
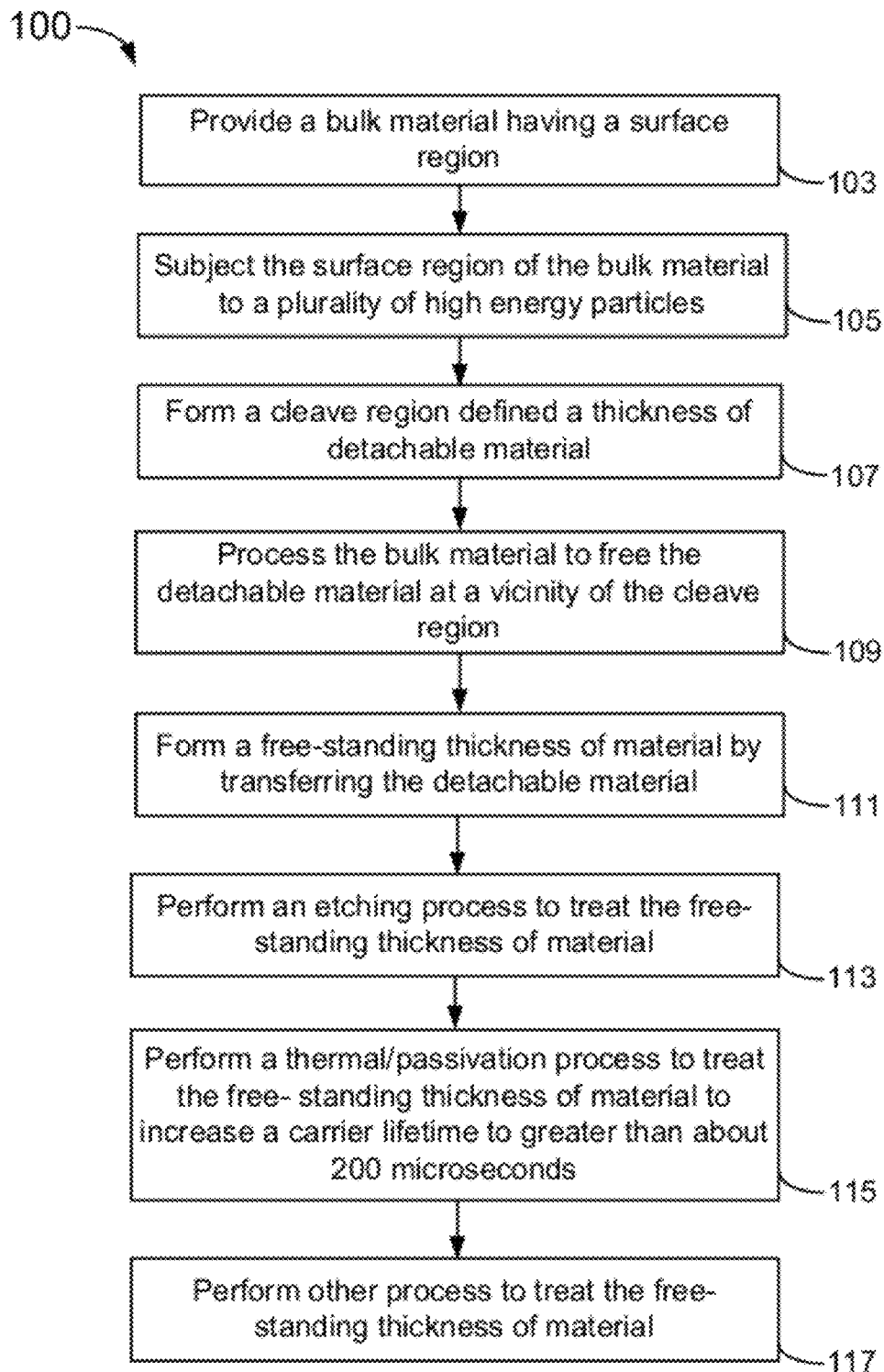
FIG. 1 is a simplified flow chart showing a method of forming a free-standing thickness of material according to an embodiment of the present invention.
Figure 2:
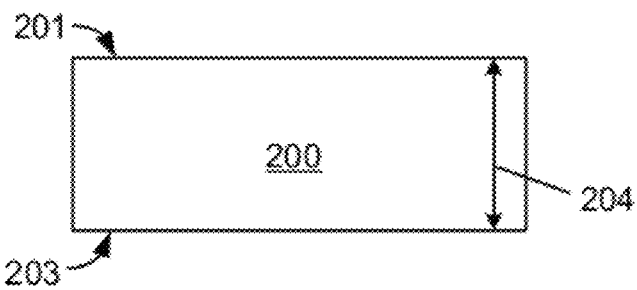
FIGS. 2-9 are simplified diagrams illustrating the method 100 of forming a free-standing thickness of silicon material with a total thickness variation less than 5% and a recovered carrier lifetime about 200 microseconds according to an embodiment of the present invention.

In a specific embodiment of a process flow 100 shown in FIG. 1, a method 100 for fabricating a free-standing thickness of material having a total thickness variation (TTV) of less than 5% is provided as follows:

1. Provide (103) a bulk material having a surface region;
2. Subject (105) the surface region of the bulk material to a plurality of high energy particles;
3. Form (107) a cleave region defined a thickness of detachable material;
4. Process (109) the bulk material to free the thickness of detachable material at a vicinity of the cleave region;
5. Form (111) a free-standing thickness of material by transferring the detachable material;
6. Perform (113) at least an etching process to treat the free-standing thickness of material;
7. Perform (115) a thermal process to treat the free-standing thickness of material to increase a carrier lifetime to greater than about 200 microseconds; and 8. Perform (117) other process to treat the free-standing thickness of material.

The above sequence of steps provide a method 100 of forming a free-standing thickness of material with total thickness variation of less than 5% and a carrier lifetime greater than 200 μsec according to an embodiment of the present invention. Other alternatives can also be provided where steps may be added, one or more steps may be removed, or one or more steps may be provided in a different sequence without departing from the scope of the claims herein.

According to embodiments of the present invention, one after another free-standing thickness of material is separated from a bulk material utilizing high energy implantation followed by a controlled cleaving process. In one embodiment, a free-standing thickness of semiconductor material such as single crystal silicon, having a thickness of 20 μm or greater, may be cleaved from a bulk silicon ingot. In one embodiment, one or more doses of high energy particles, in particular, ions are implanted through the surface region into a depth of the bulk silicon ingot to form the cleave region. In some implementation, multiple doses at various temperatures are utilized to enhance stress level in the cleave region, effectively forming a thickness of detachable material from the vicinity of the cleave region. In another embodiment, the controlled cleaving process results in much reduced amount of silicon material that is otherwise lost to the kerf in a conventional wire cutting process. The resulting cleaved free-standing single crystal silicon film with a thickness between 20 μm and 150 μm may be particularly suited for use in the collection of solar energy.

For purposes of clarifying the present and later disclosures, a "free-standing film" or "free-standing layer" or "free-standing thickness of material" is defined as a film of material that can maintain its structural integrity (i.e. not crumble or break apart), without being in contact with a supporting member such as a handle or transfer substrate. Typically, very thin films (for example silicon films thinner than about 5-10 μm) are unable to be handled without breaking. Conventionally, such thin films are manipulated using a supporting structure, which may also be needed to create the thin film in the first place. Handling of thicker films (i.e. silicon films having a thickness of between 20-150 μm) may be facilitated by the use of a support, but such a support is not mandatory. Accordingly embodiments of the present invention relate the fabrication of free-standing thickness of silicon materials having a thickness of greater than 20 μm with a total thickness variation of less than 5%.

In a specific embodiment, the present method is applied successively to cleave multiple slices of free-standing layers from a single ingot, e.g., silicon boule. That is, the method 100 can be repeated to successively cleave slices (similar to cutting slices of bread from a baked loaf) according to a specific embodiment. Of course, there can be other variations, modifications, and alternatives.

FIGS. 2-9 are simplified diagrams illustrating the method 100 of forming a free-standing thickness of silicon material with a total thickness variation less than 5% and a recovered carrier lifetime about 200 microseconds according to an embodiment of the present invention. These diagrams are merely examples, which should not unduly limit the scope of the claims recited herein. One of ordinary skill in the art would recognize many variations, modifications, and alternatives.

As shown, the method begins with a process (103) of providing a semiconductor bulk material 200 having a surface region 201, a backside 203 and a thickness 204. Such thickness can be an entirety of an ingot or sliced from a larger ingot or the like. Specifically, the thickness 204 may represent that of an entirety of the bulk material in its original form (e.g. as an entire ingot, boule, tile, or plate), or may represent a thickness of the bulk material previously separated from its original form (e.g. by sawing or slicing an original ingot, boule, tile, or plate). In a preferred embodiment, the semiconductor substrate or bulk material can be a photosensitive material. In a specific embodiment, the semiconductor substrate or bulk material can be a single crystal silicon wafer or ingot, a polysilicon cast wafer, tile, or substrate, a silicon germanium wafer, a germanium wafer, a substrate of group III/V materials, group II/VI materials, gallium nitride, or the like. In another specific embodiment, a single crystal silicon ingot with a resistivity of about 0.2 to 12 ohm centimeter. Such silicon ingot includes a substantially circular shape as grown along a certain crystallographic direction. Further the surface region 201 of the silicon ingot is obtained by cutting one or more sides of the ingot to exhibit other than a substantially circular cross-sectional profile. For example, the surface region 201 being provided is in substantially square or rectangular shape with a small miscut angle in {100}, {110} or {111} crystallographic plane. Certain embodiments indicate that cleaving is easier along a plane substantially in parallel to {110} or {111} crystallographic plane and the as-cleaved surface is smoother. Other examples of bulk materials include polycrystalline silicon plates or tiles exhibiting a square, rectangular, or trapezoidal profile. Of course there can be other variations, modifications, and alternatives. As an example, picking up substantially {110} or {111} crystallographic plane as the surface region for forming free-standing silicon films has been described in U.S. Patent Application No. 61/051,344 titled "METHOD AND DEVICE FOR SLICING A SHAPED SILICON INGOT USING LAYER TRANSFER" filed May 7, 2008, commonly assigned to Silicon Genesis Corporation of San Jose, Calif., and hereby incorporated by reference for all purposes.

Figure 3:
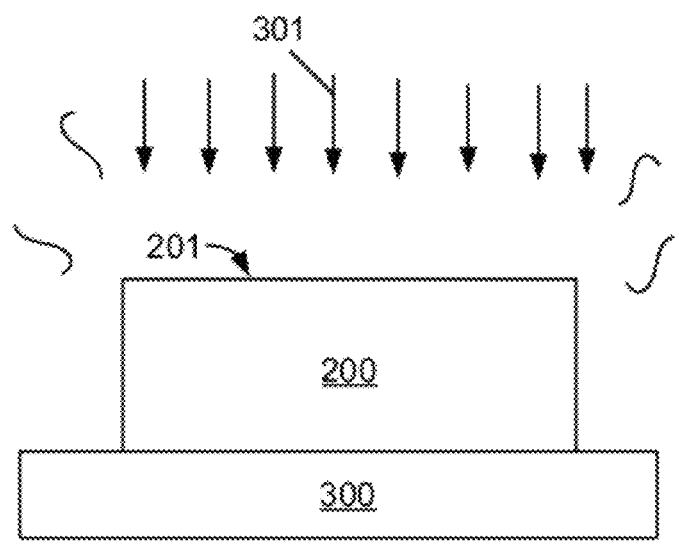

Referring to FIG. 3, the method (100) includes a process (105) of subjecting the surface region 201 of the semiconductor substrate or bulk material 200 to a first plurality of high energy particles 301. The semiconductor substrate or bulk material 200 now is supported on a stage 300 within a processing system coupled with a linear accelerator (not directly shown). In accordance with particular embodiments, the high energy particles 301 are generated using the linear accelerator. Depending upon the application, according to particular embodiments smaller mass particles are generally selected to reduce the energy requirement for implantation to a desired depth in a material and to reduce a possibility of damage to the material region according to a preferred embodiment. For example, the smaller mass particles (or energetic particles), preferably ion species of hydrogen and its isotopes, rare gas ions such as helium and its isotopes, and neon, or others are used depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface region.

For example, using hydrogen as the implanted species into the silicon wafer as an example, the implantation process is performed using a specific set of conditions. Implantation dose ranges of hydrogen from about $1 \times 10^{15}$ to about $1 \times 10^{16}$ atoms/cm$^2$, and preferably the dose of implanted hydrogen is less than about $8 \times 10^{16}$ atoms/cm$^2$, and may be less than about $5 \times 10^{16}$ atoms/cm$^2$. Implantation energy ranges from about 1

MeV and greater to about 2 MeV or even 5 MeV and greater, for the formation of thick films useful for photovoltaic applications. Implantation temperature ranges from about −50 Degrees Celsius to about +400 Degrees Celsius, and in certain embodiments may be between about 100-250 Degree Celsius. Implantation temperature is preferably less than about 400 Degrees Celsius to prevent a possibility of hydrogen ions from diffusing out of the implanted silicon wafer. The hydrogen ions can be selectively introduced into the silicon wafer to the selected depth at an accuracy of about ±0.03 to ±1.5 microns depending on the incident ion energy. Of course, the type of ion used and process conditions depend upon the application.

Figure 4:
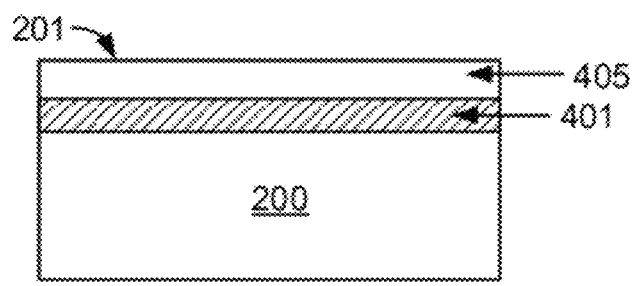

In a specific embodiment at Process 107 of the method 100, the particles cause formation of a plurality of gettering sites or an accumulation region within a cleave region 401, which is provided beneath the surface region to define a thickness of a detachable material 405, as shown in the simplified diagram of FIG. 4. Preferably, the first plurality of high energy particles provide an implant profile having a peak concentration and a base spatially disposed within a depth of the semiconductor bulk material. Preferably, the base can have a width of about 2 Rp and less, where the depth variation of an implant concentration profile is called the longitudinal straggle (denoted by Rp). In one implementation for a 3.5 MeV hydrogen implant in silicon ingot, the implant depth is about 120 μm, and the Rp is about 3 μm.

In a specific embodiment, a silicon film thickness ranges from about 20 μm to about 150 μm may be formed using a proton implant having an energy range of about 1 MeV to about less than 5 MeV. This range of silicon film thickness allows the detachment of a free-standing thickness of a single-crystal silicon material. Single crystal silicon films or free-standing thickness of silicon materials in the thickness range of about 20 μm to about 150 μm according to embodiments of the present invention may be used to replace conventional methods of using wafer sawing, etching, and/or polishing processes. As opposed to about 50% kerf loss in the conventional technologies such as multi-wire slurry saws (kerf loss as being defined as the ratio of the material lost during the cutting and wafering operations), the implant cleaving technique according to embodiments of the present invention has virtually no kerf loss resulting in substantial cost savings and material utilization efficiency improvements. Energies higher than 5 MeV may be used to make semiconductor processing alternative substrate materials, but in solar cell manufacturing, 200 μm or less, preferably within about 20 μm to about 120 μm or thicker, is desired for silicon solar cell material thickness for bulk silicon solar cell formation. As a result, thicker silicon substrates are not of particular commercial interest for fabricating solar cell according to a specific embodiment.

Figure 5:
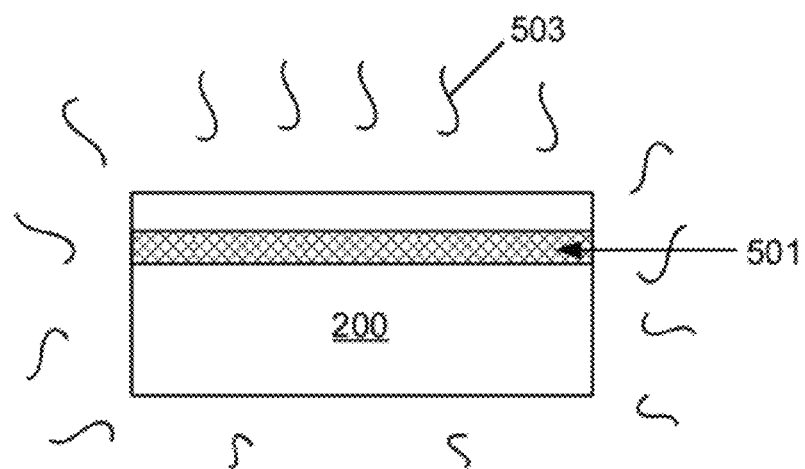

Referring now to FIG. 5, an embodiment in accordance with the present invention may optionally perform a process 503 on the semiconductor bulk material to further form the plurality of gettering sites within the cleave region 501. In one example, the process 503 includes beam or non-beam approaches such as laser beam, electron beam, thermal annealing and/or quenching the cleave region 501 to fix the plurality of first particles in place. 501 also includes possible hydrogenation process. The thermal treatment provides a fixed network of defects that can act as efficient sites for gettering and accumulating particles in a subsequent implantation or particle accumulation/diffusion process. In an implementation, the thermal treatment process 503 is associated with a first temperature range from 200 Deg C. to 600 Deg C. In one embodiment, the process 503 is part of Process 109 of the method 100.

Figure 6:
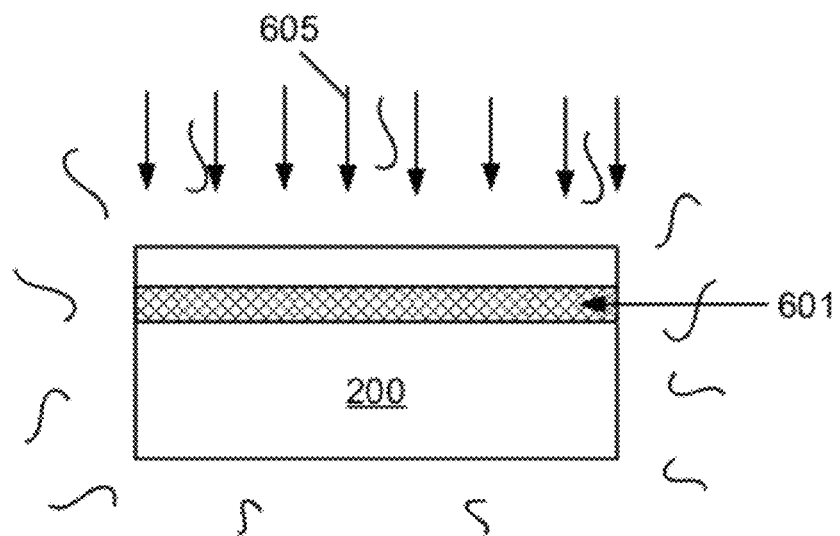

In a specific embodiment, the method includes subjecting the surface region of the semiconductor bulk material to a second plurality of high energy particles, which may be generated using the linear accelerator, as illustrated in the simplified diagram of FIG. 6. As shown, the method includes the second plurality of high energy particles 605, which are introduced to the surface region of the silicon bulk material. The second plurality of particles 605 are introduced into the cleave region 601, which increases a stress level of the cleave region 601 from a first stress level to a second stress level from the second plurality of high energy particles 605. In a specific embodiment, the second stress level is suitable for a subsequent cleaving process. In an implementation, the semiconductor bulk material is maintained at a second temperature range, which in average is higher than the first temperature range. In one embodiment, FIG. 6 shows a process that is part of Process 109 of the method 100. Temporal and spatial variations of temperature can also be utilized to optimize the cleaving function by minimizing the required implant dose.

Optionally, specific embodiments of methods in accordance with the present invention include a thermal treatment process after the implanting process. According to a specific embodiment, the present method uses a thermal process ranging from about 450 to about 650 Degrees Celsius for silicon material. In a preferred embodiment, the thermal treatment can occur using conduction, convection, radiation, or any combination of these techniques includes beam or non-beam approaches such as laser beam, electron beam. The high-energy particle beam may also provide part of the thermal energy and in combination with an external temperature source to achieve the desired implant temperature. In certain embodiment, the high-energy particle beam alone may provide the entire thermal energy desired for implant. In a preferred embodiment, the treatment process occurs to optimize the cleave region for a subsequent cleave process. Of course, there can be other variations, modifications, and alternatives.

Figure 7:
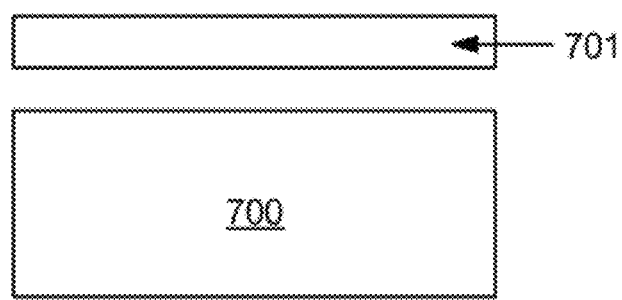

A specific embodiment of a method according to the present invention includes a process of freeing the thickness of detachable material using a cleaving process, while the detachable material is free from an overlying support member or the like, as illustrated by FIG. 7. As shown, a thickness of detachable material 701 is removed from the remaining portion of the semiconductor bulk material 700. In one embodiment, this process is substantially the same as the Process 111 of the method 100. In a specific embodiment, the process of freeing the thickness of detachable material can be performed using a controlled cleaving process. The controlled cleaving process provides a selected energy delivering from external energy source such as laser beam, electron beam or non-beam within a portion of the cleave region of the donor substrate. As merely an example, the controlled cleaving process has been described in U.S. Pat. No. 6,013,563 titled "CONTROLLED CLEAVING PROCESS", as well as in U.S. Patent Application No. 61/092,683 titled "LAYER TRANSFER OF FILMS UTILIZING CONTROLLED PROPAGATION", filed at Aug. 28, 2008, both commonly assigned to Silicon Genesis Corporation of San Jose, Calif., and hereby incorporated by reference for all purposes. As a particular implementation example of the controlled cleaving process, an in-plane shear component of the thickness of detachable material from the semiconductor bulk material can be controlled to be maintained near zero so that the cleaving action is substantially restricted within a vicinity of the cleave region. More details about the shear control during the controlled cleaving process can be found in U.S. Patent Application No. 61/051,307 titled "LAYER TRANSFER OF FILMS UTILIZING CONTROLLED SHEAR REGION", commonly assigned to Silicon Genesis Corporation of San Jose, Calif., and hereby incorporated by reference for all purposes. As another example, part of the method of forming a free-standing thickness of material regarding to the implantation process using high energy particles generated by linear accelerator can be found in U.S. patent application Ser. No. 11/935,197 titled "METHOD AND STRUCTURE FOR THICK LAYER TRANSFER USING A LINEAR ACCELERATOR" commonly assigned to Silicon Genesis Corporation of San Jose, Calif., and hereby incorporated by reference for all purposes. As shown, the method in accordance with an embodiment of the present invention frees the thickness of detachable material from the semiconductor bulk material to cause a formation of a free-standing thickness of material. Of course, there can be other variations, alternatives, and modifications. For example, the as-cleaved free-standing thickness of material can have a thickness ranging from 20 μm to 150 μm with a total thickness variation (change in thickness versus an average thickness) of less than 5%, which can be stored into a specially designed cassette or holder allowing both its front surface and back surface to be additional processed according to the present invention. Further information about the specially designed cassette can be found in U.S. patent application Ser. No. 11/956,319 titled "CARRIER APPARATUS AND METHOD FOR SHAPED SHEET MATERIALS" filed Dec. 13, 2007, commonly assigned to Silicon Genesis Corporation of San Jose, Calif., and hereby incorporated by reference for all purposes.

However, the as-cleaved free-standing thickness of single crystal silicon materials carry certain degrees of structural damages, both exterior surfaces and interior defect networks, due to the high-energy particle implantation and the cleaving process. These damages affect the photonic-electrical properties of the silicon films for making high efficiency solar cells. For example, the average surface roughness (RMS surface roughness) is typically about 100-300 nm (measured by AFM within a 20 micron square area). The defects within a surface layer corresponding to the implant straggle Rp may cause light absorption within the surface layer, reducing overall efficiency of light-electrical conversion. Structural damages in the interior defect networks could change the density of recombination centers causing substantial reduction in minority carrier lifetime. For example, the minority carrier lifetime for an as-cleaved silicon film without further treatment may just be about 20 microseconds or less, which directly affects the conversion efficiency. Therefore, embodiments of the present invention further include certain treatment processes for removing or repairing the damage, including at least smoothening surfaces and recovering the carrier lifetime of the free-standing thickness of silicon materials.

The present invention includes a carrier lifetime recovery process of a free-standing silicon material having a thickness ranging from about 20 μm to 150 μm. In one embodiment, the free-standing silicon material is subjected to a sequence of RTA-anneal and wet chemical clean/etch, followed by surface passivation. Then a lifetime measurement using a photoconductance decay (PCD) system, such as a Sinton Consulting WCT-120 Lifetime Tester, is performed. The preparation steps, anneal and clean/etch, may be performed in any sequence so as to optimize a gettering effect of any unwanted contaminants. Furthermore, the amount of material to be removed via clean/etch is determined in combination with the specific RTA-anneal temperature and time. Upon annealing, any unwanted contaminants such as trace metals will diffuse out or be gettered out to surfaces of the free-standing silicon material, which can then be cleaned and etched off.

The anneal-etch or etch-anneal gettering treatment mentioned above is applicable not only for the free-standing single crystal silicon material, but also for other lower grade silicon, such as metallurgical grade silicon (MGS). The contamination reduction or elimination may be controlled during the cleave process and any anneal prior to etching. Excessive cleave/anneal temperature and time before etching step may result in driving in any contaminants present on the material surfaces even deeper and degrading the lifetimes. The clean/etch and anneal cycle may be done in a single-step or multiple-steps, depending on the contamination level. In one embodiment, a single-step is sufficient to recover the lifetimes of the free-standing silicon material to about 200 μsec or greater at MCD (excess minority carrier density) of about $1 \times 10^{15}$ cm$^{-3}$. Once the free-standing silicon material has been annealed and cleaned/etched, it is then passivated prior to lifetime measurement to allow a more accurate measurement of bulk lifetime. Using chemical passivation for example, the material is placed in a transparent plastic bag (i.e., Ziploc bag) and passivated with iodine/methanol solution. The effective lifetimes are subsequently measured using a PCD system.

In one example, the clean and etch processes include but not limited to the following chemicals: Piranha (H2SO4/H2O2), SC-1 (NH4OH/H2O2/DI H2O), SC-2 (HCl/H2O2/H2O), dilute HF, and HNA (HF/HNO3/CH3COOH). Other silicon etchants, such as KOH, TMAH, etc., may also be used as well.

In another example, to minimize the recombination of minority carriers at the surfaces of the free-standing silicon material, which is crucial for the performance of the solar cells, solution of iodine in methanol is utilized as surface passivation (i.e., 3.25 grams I2 in 250 ml CH3OH). However, other passivation methods may also be used as well; for example, iodine in ethanol, hydrofluoric acid, silicon nitride, porous silicon, silicon dioxide, etc.

In yet another example, a PCD system, such as a Sinton Consulting WCT-120 Lifetime Tester is used to measure the effective carrier lifetimes of the free-standing silicon material. Other carrier lifetime testers, such as Semilab Microwave-PCD, may be used as well.

In the present invention, one or more thermal processes can easily and efficiently provide the necessary heating environment for a hydrogenation or hydrogen passivation. In one implementation, the hydrogen atoms are thermally diffused from a hydrogen source (such as above mentioned iodine/methanol solution) in contact with the cleaved thickness of free-standing thickness of silicon material. In one embodiment, this method provides a cost-effective approach by starting with a hydrogenated thickness for the free-standing silicon material so that the additional hydrogenation procedures in commercial solar cell manufacture can be eliminated. In one embodiment, even for conventional wafer sawing, the associated saw damage etch and cell processing anneals can be replaced by the etching-cleaning-annealing combination process mentioned above to achieve certain cost saving.

Figure 8:
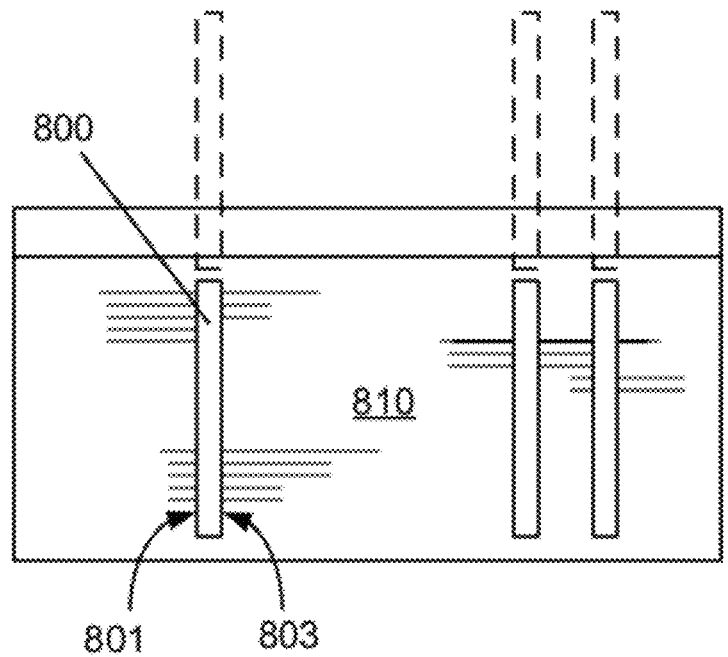

FIG. 8 is a simplified diagram showing an etching process to repair exterior surfaces of the free-standing thickness of material according to an embodiment of the present invention. This diagram is merely an example, which should not unduly limit the scope of the claims recited herein. One of ordinary skill in the art would recognize many variations, modifications, and alternatives. As shown, both the front surface 801 and back surface 803 of the free-standing thickness of material 800 is merged into an etchant environment 810 to react with one or more etchant species. In one example, the one or more etchant species is in a form of a solution of HF, nitric and acetic acid. As the free-standing thickness of material 800 is dipped into the solution for a predetermined period of time, etchant species react with the surface atoms in both the front surface 801 and the back surface 803, resulting in removals of a certain amount of material respectively from both the front surface 801 and the back surface 803. In an embodiment, a plurality of free-standing thickness of materials 800 can be arranged to be dipped in the etchant environment 810 at the same time.

The etching reaction of this dipping-in process progresses relatively uniformly in all directions for an isotropic etchant while an anisotropic etchant will tend to develop structure and faceting on the surface. Using an isotropic etchant for example, high frequency protrusions and other structural features on the surfaces experience a higher surface area exposed to the etchant, effectively increasing etching rate. As a result, certain etching processes are able to smoothen the surface scratches and rough polish defects obtained from the cleaving process. In one implementation, the etching process removes three to five microns of material to remove the implant damage layer and smooth the surface. Generally, the required etching will be a function of the implant straggle and thus scale with cleave thickness. For hydrogen in silicon in the 1-5 MeV implant energy range, the Rp is about 2.5% of the implant range. As a rule, the required amount of removal is about two to three times Rp or about 5 to 7.5% of the thickness. This is a much lower etch loss compared to conventional sawing process which must be done after the high kerf loss sawing process itself. In certain embodiments, the etching process develops a texture on either the front surface or the back surface characterized by higher light trapping capability. The texture developed by the etching process creates a surface characteristic with lower light reflectance and higher absorption for the thin film to capture more light energy. Additionally, the smoothened surface is characterized by a reduced RMS surface roughness. In particular, the RMS surface roughness for each of the front surface and the back surface is measured from a first edge region of the free-standing thickness of silicon material to a second edge region on the opposing side across an area of the free-standing thickness of silicon material. In another specific embodiment, the free-standing thickness of material after the etching process becomes substantially free from surface damage.

Due to substantially uniform etching if care is exercise to allow uniform mixing and temperature control during the etching step, the thickness variation of the free-standing thickness of material is substantially not affected. Therefore, after the dipping in the etching process, the treated free-standing thickness of material becomes thinner from each surface (front or back) by three to five microns while the film thickness variation (i.e., change in thickness across the surface over an average thickness) is substantially retained as that before the etching process. In one embodiment of the present invention, the free-standing thickness of material can have a starting thickness ranging from about 20 microns to 150 microns with a total thickness variation of less than 5%. As in one specific implementation, the etching process is substantially a part of the etching-cleaning-annealing process 113 of the method 100. In certain alternative embodiments, the free-standing thickness of material also can be subjected to additional side etching for repairing the edge quality and yield.

Figure 9:
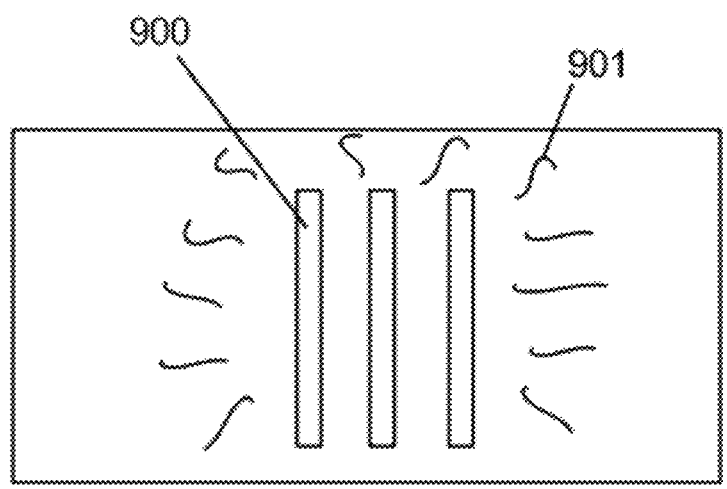

FIG. 9 is a simplified diagram showing a thermal process to recover carrier lifetime of the free-standing thickness of material according to an embodiment of the present invention. This diagram is merely an example, which should not unduly limit the scope of the claims recited herein. One of ordinary skill in the art would recognize many variations, modifications, and alternatives. As shown, the free-standing thickness of material 900 is subjected to a thermal process 901 associated with a process temperature. One or more such free-standing thickness of materials can be processed at the same time in one chamber or the like. The process temperature can be ramped up quickly to a predetermined temperature range, for example, between about 400 Degrees Celsius and about 800 Degrees Celsius. In one embodiment, the thermal process 901 is substantially the same as the Process 115 of the method 100. In an implementation, a rapid thermal processor is used for performing the thermal treatment for a plurality of stand-alone samples. As the thermal power delivered into the interior portion of each free-standing thickness of material 900, the defect networks thereof are annealed during which a plurality of trapped implanted particles (e.g., hydrogen ions) are released from respective silicon lattice defect structures. The removal of the trapped hydrogen and the dissolution of vacancy and interstitial complexes that were produced by the implantation process, which could otherwise act as additional recombination centers for the photogenerated carriers, are effectively reduced. Correspondingly, the obtained minority carrier lifetime should be substantially higher compared to the material before the thermal process 901. In one implementation, this results in a desired recovery of the minority carrier lifetime from 10 μsec or less before back to about 200 μsec or greater after.

Carrier lifetime in semiconductors is a very effective parameter to characterize the purity of a material or device. The lifetime measured is often referred to as an effective lifetime. In many practical cases, there may be several sources of recombination in a sample—such as recombination through impurities or defects in the bulk wafer, or recombination at the surfaces. The effective lifetime represents the combined effect of all of these competing recombination channels. There are certain recombination mechanisms listed below which contribute to bulk lifetime:

(1) Auger recombination ($\tau_{Auger}$) depends on doping type and concentration, injection level or excess carrier concentration;
(2) Radiation recombination ($\tau_{rad}$) depends on doping type and concentration, injection level or excess carrier concentration, but much larger than ($\tau_{Auger}$);
(3) Shockley-Read-Hall recombination ($\tau_{Auger}$) is recombination through impurities and defects in the bulk of the wafer;
A total bulk lifetime of measured silicon will be represented in the following equation:

$$1/\tau_{bulk} = 1/\tau_{Auger} + 1/\tau_{SHR} + 1/\tau_{Rad} \quad \text{(Eq. 1)}$$

For the free-standing thickness of thin silicon wafer according to certain embodiments of the present invention, the measured effective lifetime without correcting for surface recombination velocity, can be as high as 300 μsec or more. Recognizing that the successive slicing process will yield similar surfaces, the surface recombination velocity of the two surfaces are assumed to be identical ($S_{front} = S_{back}$). The measured lifetime can expressed by the equation:

$$1/\tau_{measured} = 1/\tau_{bulk} + 2S_{front}/W, \quad \text{(Eq. 2)}$$

where S defines as surface recombination velocity with the units cm/s, which characterizes the electrical effect of surface damage and other recombination centers such as impurities and defects at the surface. Surface and bulk contributions to the lifetime can be robustly separated by a 'thickness variation' experiment.

As merely an example, the carrier lifetime can be recovered from 10 μsec for just-cleaved free-standing thickness of material to 300 μsec after the recovery process. If a value of 60 cm/s is assumed as the surface recombination velocity, the recovered bulk lifetime is estimated to be in excess of 1 msec, comparable to that of a typical starting silicon tile/ingot/boule lifetime.

Figure 10A:
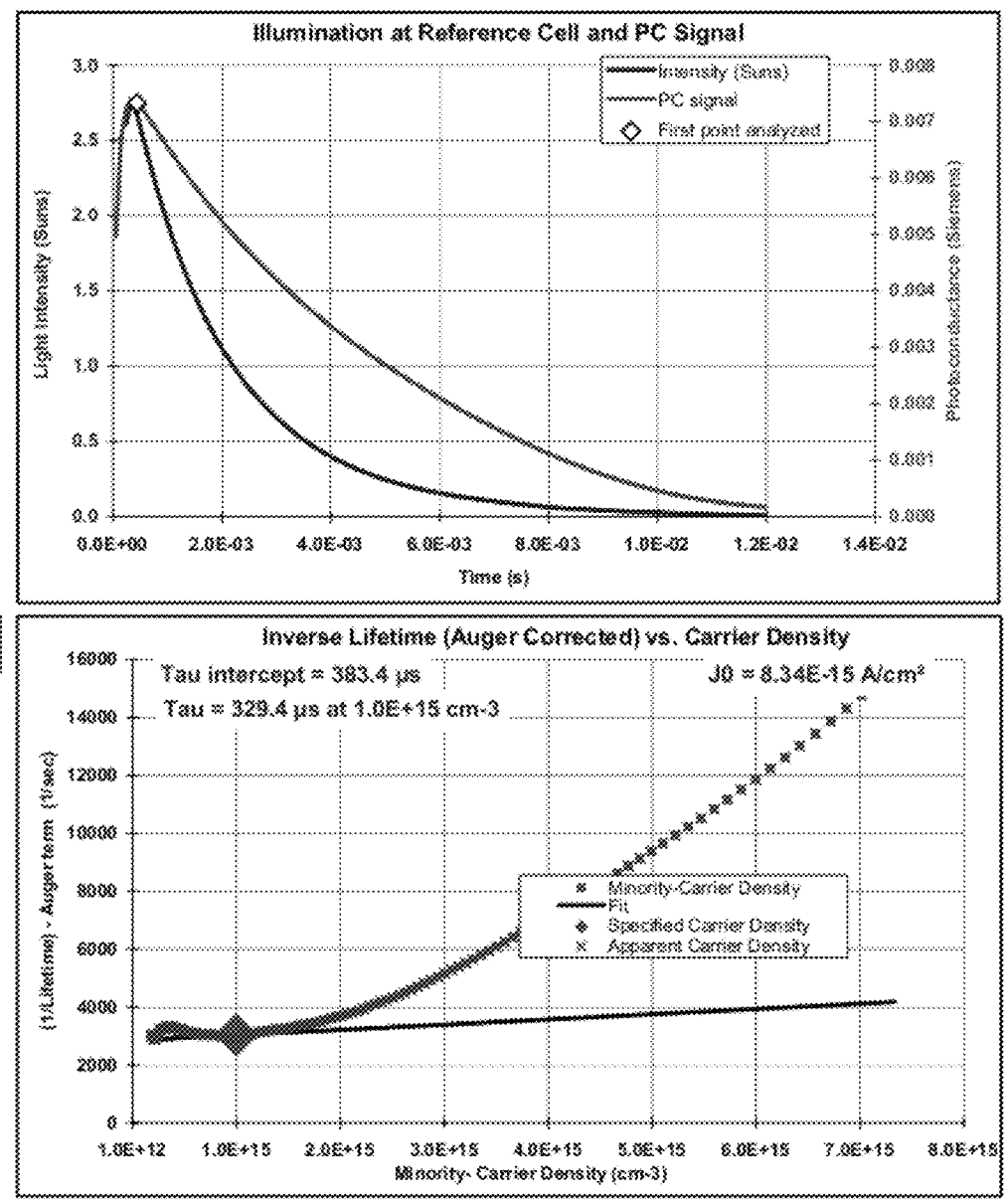
FIGS. 10A and 10B are exemplary carrier lifetime measurements for the free-standing thickness of silicon material after the lifetime recovery process according to an embodiment of the present invention.
Figure 10B:
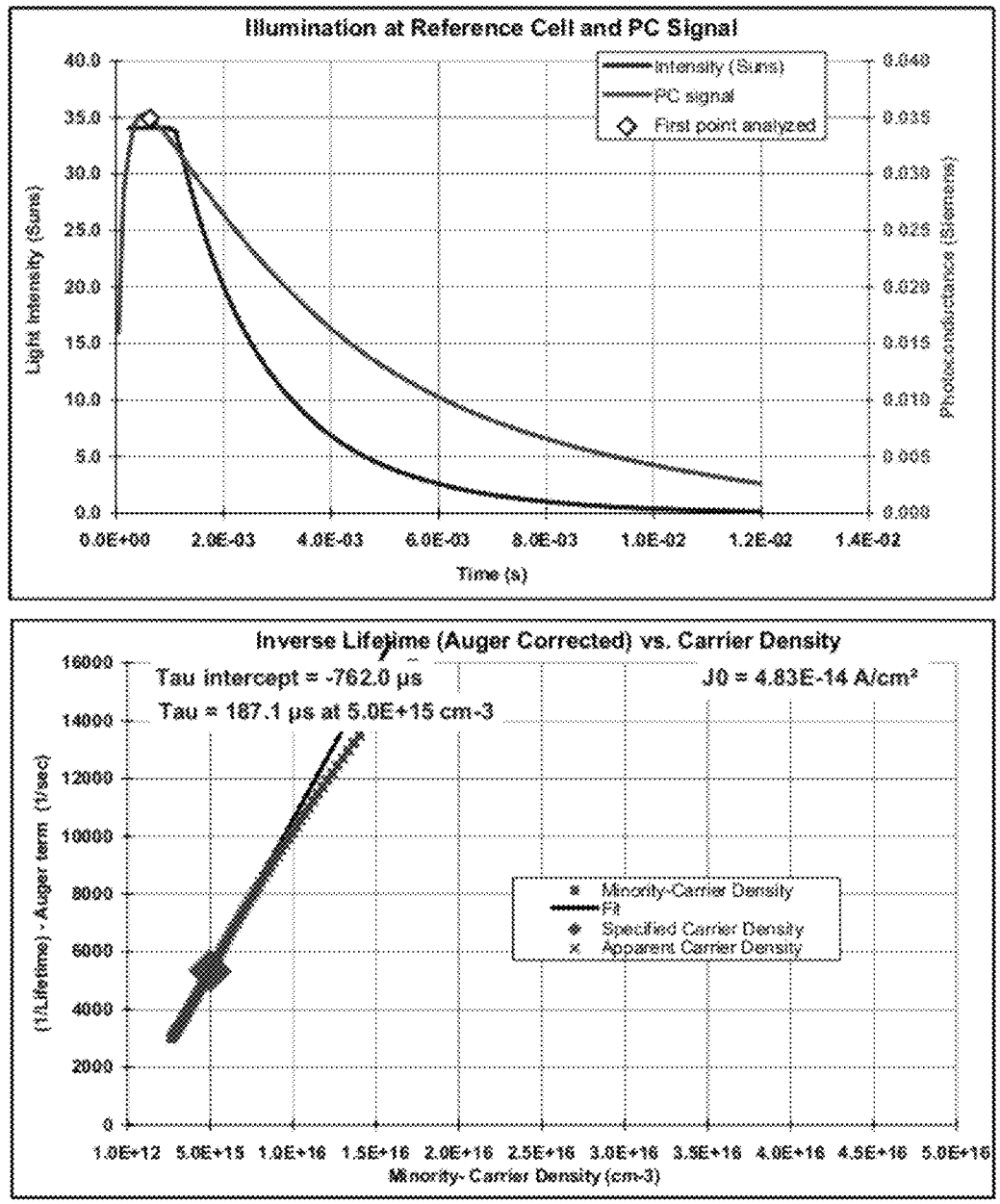

FIGS. 10A and 10B are exemplary carrier lifetime measurements for the free-standing thickness of silicon material after the thermal treatment according to an embodiment of the present invention. These diagrams are merely examples, which should not unduly limit the scope of the claims recited herein. One of ordinary skill in the art would recognize many variations, modifications, and alternatives. As shown, the plot on the top of FIG. 10A shows light intensity versus time, wherein both the sun light intensity and a PC signal is recorded for a reference solar cell made by one of the free-standing thickness of Si material and a first point analyzed is marked as a diamond. The plot on the bottom of FIG. 10A shows the measured inverse minority carrier lifetime versus minority carrier density. The material used is made from boron-doped P-type material (with a boron impurity density of $1.4 \times 10^{15}$ cm$^{-3}$). At a specified relative excess minority carrier density of $1.0 \times 10^{15}$ cm$^{-3}$, the carrier lifetime is mainly contributed by impurity/defect related recombination and less affected by Auger recombination. Still, the Auger term can be corrected, as shown in above measurement. Using a tangential fit at the specified carrier density point, an inverse carrier lifetime can be obtained. The resulted carrier lifetime is about 330 μs for the specified carrier density.

Similarly, FIG. 10B shows a carrier lifetime measurement done for the same reference material with a relative high carrier density. After correcting the Auger term in the recombination rate measurement, the result indicates the carrier lifetime is nearly 200 μsec at a specified excess minority carrier density of $5.0 \times 10^{15}$ cm$^{-3}$. These two general light photoconductivity operation regimes are called "low-level injection" and "high-level injection" conditions. The levels are typically defined as the regimes where the excess minority carrier density is below (low-level injection) or above (high-level injection) dopant concentration. Both shows the minority carrier lifetime of the free standing thickness of material made using the method according to embodiments of the present invention has been effectively recovered to around 200 μsec level. According to some researches, solar cell conversion efficiency, assuming an infinite-mobility-limit, can be about 20% or less for single crystal silicon film in 20-150 μm thickness range with minority carrier lifetime about 200 μsec or higher. Therefore, embodiments of the present invention provide an effective method and structure for manufacturing high efficient cost effective photovoltaic cells or devices.

In an alternative embodiment, the thermal process (or a combination of cleaning and annealing) also helps to repair some interior damages in terms of strengthening the mechanical strength of a treated sample comparing to that for an as-cleaved sample. In other words, the benefit of the thermal annealing is not only to improve the material's electrical property but also its mechanical property. For example, the free-standing thickness of materials formed according to embodiments of this invention are subjected to one or more mechanical strength tests or other processes to treat or characterize the free-standing thickness of material. The mechanical strength of single crystalline silicon is influenced by crystal orientation, sample thickness and geometry, residential stress, edge damage, surface damage, among others. Since the as-cleaved freestanding silicon sample has surface roughness of about 100-300 nm under 20 μm×20 μm AFM inspection. The excellent surface condition makes this material stronger comparing with other as-sawed wafers. The free-standing thickness of materials fabricated using the method according to embodiments of the invention are characterized by a strength of about 1 GPa and greater in fracture stress. In some examples, the free standing thickness of materials have strength of 5-10 GPa and greater in fracture stress. In certain other examples, one or more value-added processes such as texturization, surface etch, annealing or post-slicing films deposition may be applied.

Figure 11:
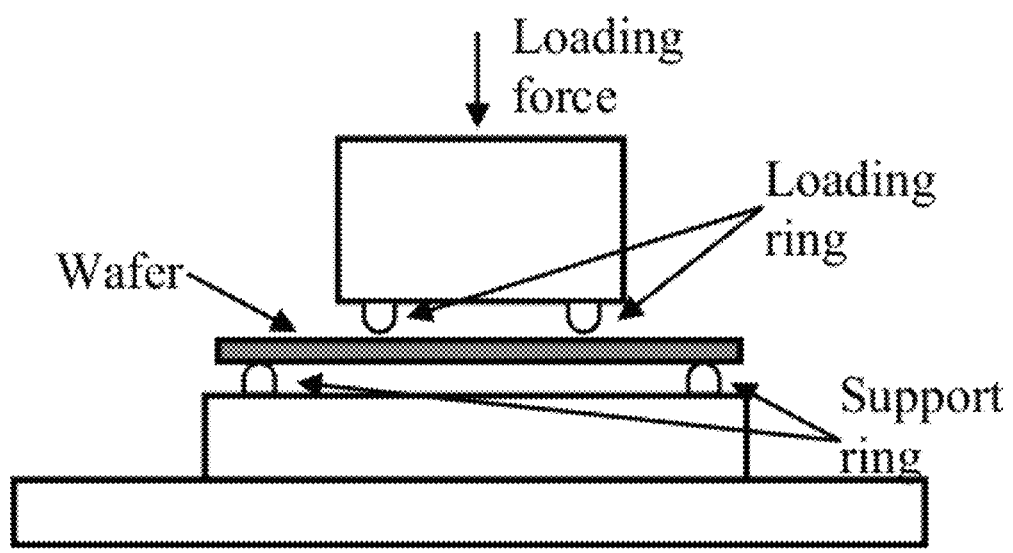
FIG. 11 shows a simplified diagram illustrating a mechanical strength test of the free-standing thickness of material according to an embodiment of the invention.

FIG. 11 shows a simplified diagram illustrating a mechanical strength test of the free-standing thickness of material according to an embodiment of the invention. As shown, a ring-on-ring test method is used to measure a fracture stress as a representative mechanical strength characteristic of the free-standing thickness of materials. The wafer mechanical strength is determined by the maximum applied stress at the moment of breaking. As shown in FIG. 11, the wafer is placed on a concentric ring-on-ring configuration. Load ring imparts uni-axial force on sample via constant vertical translation until the wafer breaks while the load and displacement are recorded. The maximum displacement and load are then converted into bi-axial stress using the relationship:

$$\sigma = \frac{3}{4\pi}\left[2(1+v)\ln\frac{a}{b} + \frac{(1-v)(a^2-b^2)}{R^2}\right]\left[\frac{F}{t^2}\right] \quad \text{(Eq. 3)}$$

where F is the applied force, t is the wafer thickness, v is the Poisson's ratio, a and b are the diameters of the support ring and the loading ring, R is the equivalent wafer diameter. As an example, the sizes of the rings used in the film measurements and compatible with the very thin substrates were chosen to be 4 mm for the loading ring, and 9 mm for the support ring. To eliminate the influence of the over-hanging effect, the as-cleaved free-standing thickness of crystalline silicon samples were diced into 10.5 mm squares. The measurement results indicate mechanical strengths in a few GPa range with good repeatability.

Figure 12:
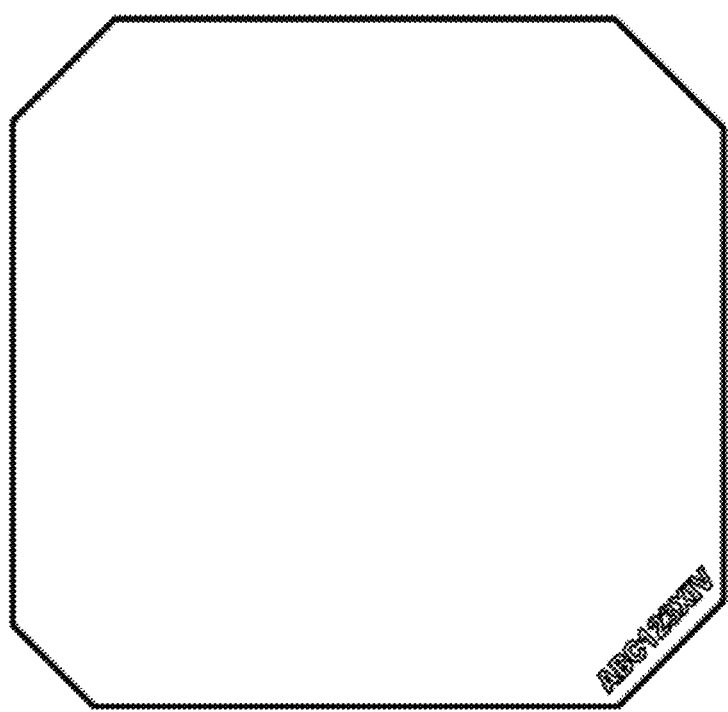
FIG. 12 shows an example of a free-standing wafer surface with laser marked ID located at a corner.

In certain embodiments, the present invention also includes a process of laser scribing identification (ID) for the free-standing thickness of wafer material. In both semiconductor and photovoltaic manufacturing, wafer ID is widely used in production tracking, sorting, storing, failure analysis and quality control. The ID data could be a unique series of the code like dots, bars, numbers, letters, etc. or a combination of them, which indicate the starting silicon ingot, the tile number, the particular loading position (like tray ID), the process date, etc. A laser scribing system is used to generate the ID codes on the surface of each freestanding material right after they detached. Laser scribing is a non-contact method, which create clean patterns with smooth edges. Smooth edges are very important for thin materials to avoid generating cracking. FIG. 12 gives an example of the free-standing wafer surface with laser marked ID located close to one of it's corner.

Figure 13:
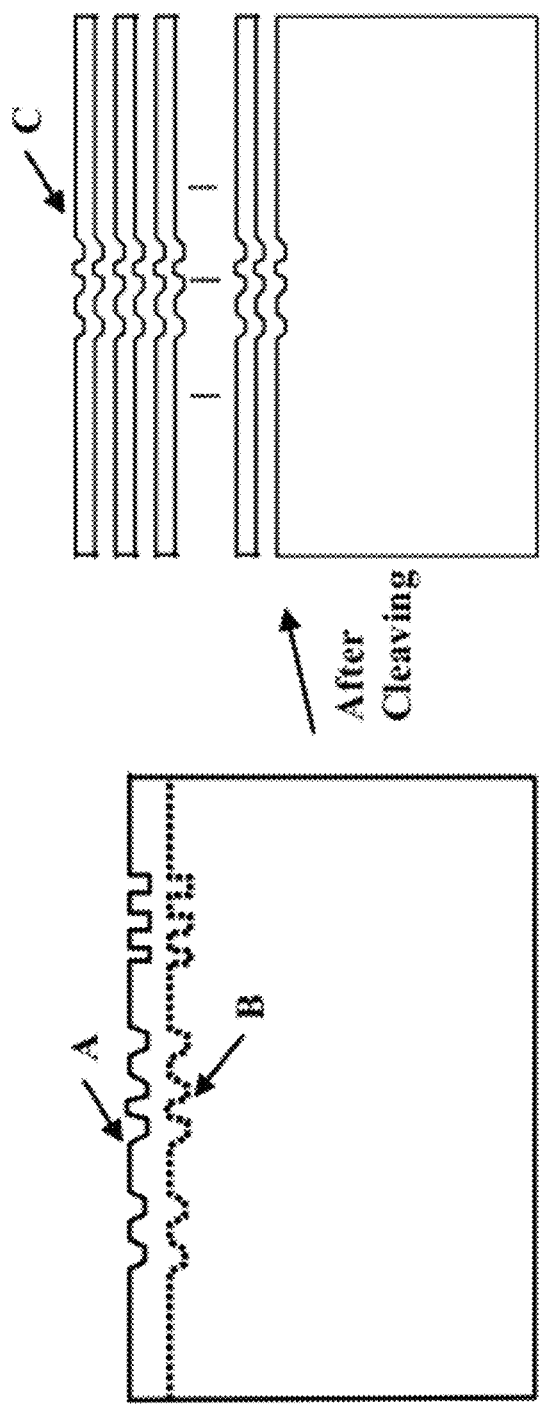
FIG. 13 shows a schematic diagram illustrating a direct pattern transfer according to an embodiment of the present invention.

In addition to the laser scribing, the technique for fabricating a free-standing thickness of silicon material described in this present invention gives another option for wafer ID coding. In one embodiment, the surface patterns (like laser scribing marks) on the starting bulk materials can be exactly transferred into the detached thickness of free-standing materials for many times. This is called "Direct Pattern Transfer". During the Process 105 when the bulk material is subjected to its surface region to a plurality of high energy particles; the particles go a certain depth from the surface, forming a lateral profile defined by the starting surface profile. FIG. 13 shows a schematic diagram illustrating a direct pattern transfer according to an embodiment of the present invention. As shown, a cross section of a silicon ingot is laser stamped to a pattern (A). After being irradiated by the particles, a cleavage region or layer is formed at a thickness beneath the surface. Accordingly, another pattern (B), substantially resemble the pattern (A), is formed at the cleave layer. After the thickness of free-standing material is detached, the laser pattern (C) is copied on its surface with substantially the same shape, dimension (lateral size and depth), and location. Generally, the transformable patterns have dimensions on the order of about 10~30 μm in depth with a diameter of 50 μm or more in diameter. Depends on the size of the starting patterns and the energy of the driven-in high energy particles, the number of transformation can be repeated many times until the pattern become vague. The "Direct Pattern Transfer" method can be used to transfer the laser ID to subsequently detached free-standing silicon materials. In this case, it eliminates many laser scribing steps on individual wafers, saves the energy and time of those steps, make the laser ID process more cost effective.

An embodiment of a beam-induced large-area crystalline silicon PV wafering process with near zero kerf-loss is described in detail below. The Direct Film Transfer (DFT) process can be utilized to slice thin (50-150 μm) PV wafers in high-volume manufacturing. The material characteristics such as lifetime, mechanical strength and TTV when monocrystalline silicon ingots are wafered using this new process are also summarized and show excellent results compared to traditional multi-wire slurry saw (MWSS) slicing methods.

Figure 14:
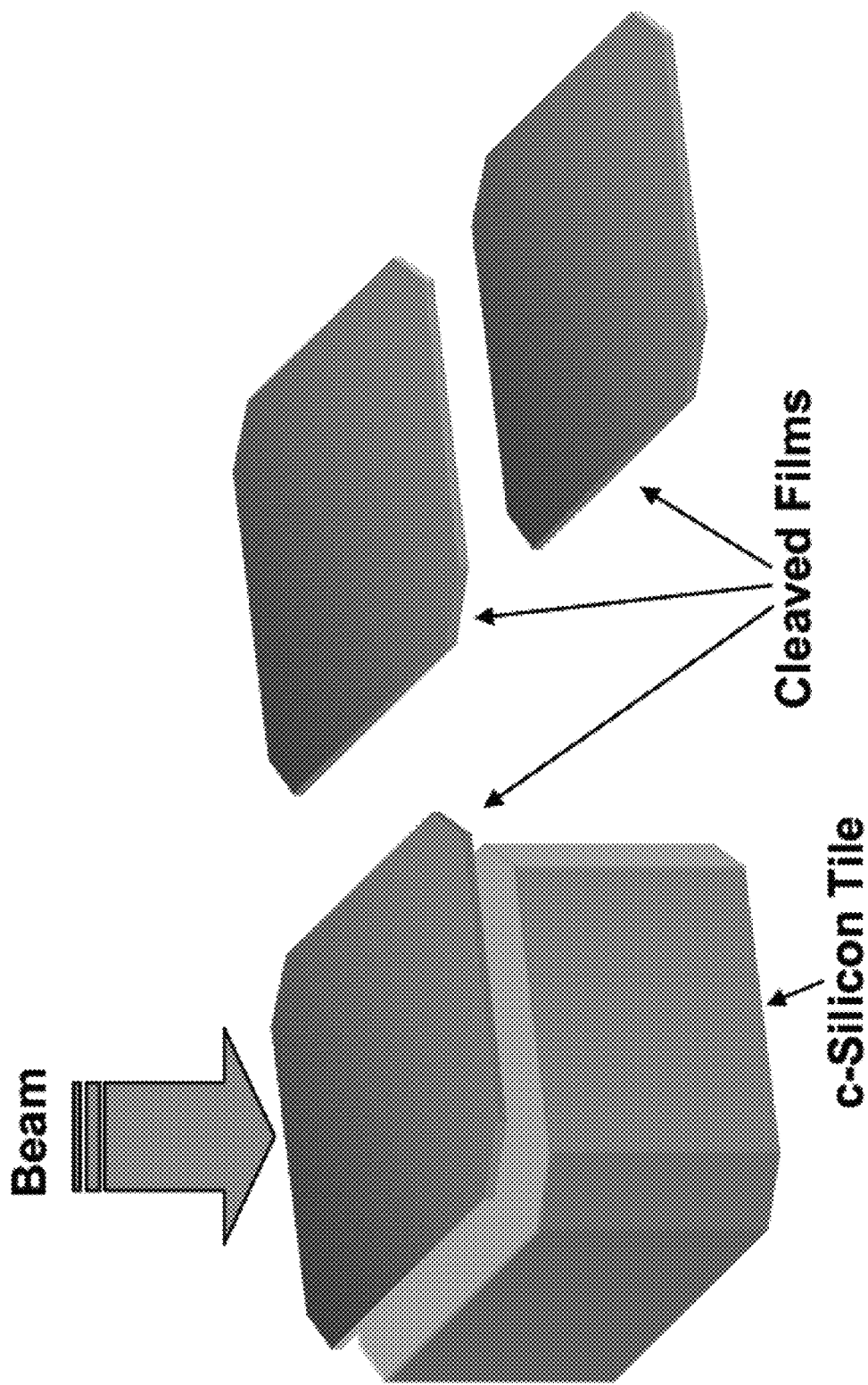
FIG. 14 is a simplified view of film transfer according to an embodiment of the present invention.

In wafered silicon PV systems, key cost areas are use of relatively thick silicon slices, high kerf loss and relative scarcity of the silicon absorber material. One approach to improve silicon use efficiency is thin-film deposition but practical approaches suffer from substantially lower conversion efficiency. Another approach presents itself by combining advanced layer-transfer cleaving methods with efficient, high-energy ion accelerator technology. The convergence of these two technologies allows a thickness of silicon made from a CZ silicon ingot to be directly detached using a high-energy light ion beam with near-zero kerf loss and with low overall process cost. The process is called Direct Film Transfer (DFT) and shown conceptually in FIG. 14. Equipment and wafers using the DFT process will be called by the trade name PolyMax™.

The DFT process eliminates many of the wafering process steps while allowing substantially thinner and low-kerf silicon thicknesses to be realized. The result is a cost and manufacturing complexity reduction. Compared to the sawing process, the DFT process is also less taxing on the environment due to (i) less overall energy is consumed since the slurry-rich sawing/wafering processes are eliminated, (ii) the use of CZ silicon and polysilicon stock are substantially reduced (energy intensive steps themselves), and (iii) no use or production of slurry, saw wire and kerf loss material.

Using elements of a hydrogen-assisted cleaving principle first demonstrated in the early 1980s by Russian researchers (V. F. Reutov and Sh. Sh. Ibragimov, Method for fabricating thin silicon wafers, USSR Inventor's Certificate No. 1282757, Dec. 30, 1983; and B. N. Mukashev & al., Hydrogen Implantation into Silicon, phys. stat. sol. (a) 91, 509 (1985), both of which are incorporated by reference in their entireties herein), the DFT process is a 2-step (implant-cleave), dry slicing technology that operates to convert squared "bricked" monocrystalline silicon ingots or tiles of about 5-10 cm thickness into PV wafers. The first step is to form a cleaving plane at the desired thickness under the tile face using high-energy hydrogen (proton) beam irradiation. The incident mono-energetic protons lose their energy as they traverse a silicon thickness to form a stressed End-Of-Range (EOR) layer. In silicon, 2-4 MeV proton energy is required to form a cleave layer at the desired 50-150 μm wafering thickness.

Proton accelerator technologies have become more commercialized and efficient due to technology advances and market drivers such as proton cancer therapy, manufacture of radio-isotopes and homeland security. For example, accelerators using compact RF-quadrupole (RFQ) technologies are now entering commercial use.

In addition, alternative ion implant apparatuses useful for embodiments of the present invention have been made recently available by the use of DC electrostatic particle accelerators such as the DYNAMITRON proton accelerator available from Ion Beam Applications SA, Belgium). Other forms of DC electrostatic accelerators which may be used include Van de Graaff or Tandem Van de Graaff accelerator types.

Still other forms of particle accelerators suitable for use in accordance with embodiments of the present invention may include radio frequency (RF) particle accelerators such as a cyclotron or a RF linear accelerator (RF Linac). Examples of possible particle accelerator types include radio-frequency quadrupole linear accelerator (RFQ-Linac) or Drift-Tube Linac (DTL), or RF (Radio)-Focused Interdigitated (RFI) technology. These are available from companies such as Accsys Technology Inc. of Pleasanton, Calif., Linac Systems, LLC of Albuquerque, N. Mex. 87109, and others.

One consideration is the need to effectively manage the substantial heat generated by the implant process. To avoid overheating the tile surfaces and achieve practical manufacturing throughput rates, a tile tray with multiple tiles assembled in an array was adopted along with fast electromagnetic scanning. In an embodiment, the tray is about 1 m×1 m in area with a 6×6 array size for 156 mm wafers and 8×8 array size for 125 mm wafers. The trays are cycled between the implant and cleave subsystems in a flexible factory material flow approach. More details of the configuration and design of the manufacturing system are presented in F. Henley & al., Kerf-Free Silicon Wafering Equipment Configurations Using Beam-Induced Cleave Technology, 23rd European Photovoltaic Solar Energy Conference visual presentation 2DV. 1.68 (2008), incorporated by reference in its entirety herein for all purposes. The tray configuration and fast scanning inherently provides the means of developing patterned dose and thermal profiles across each tile, a key element of the high productivity cleaving process.

Figure 15:
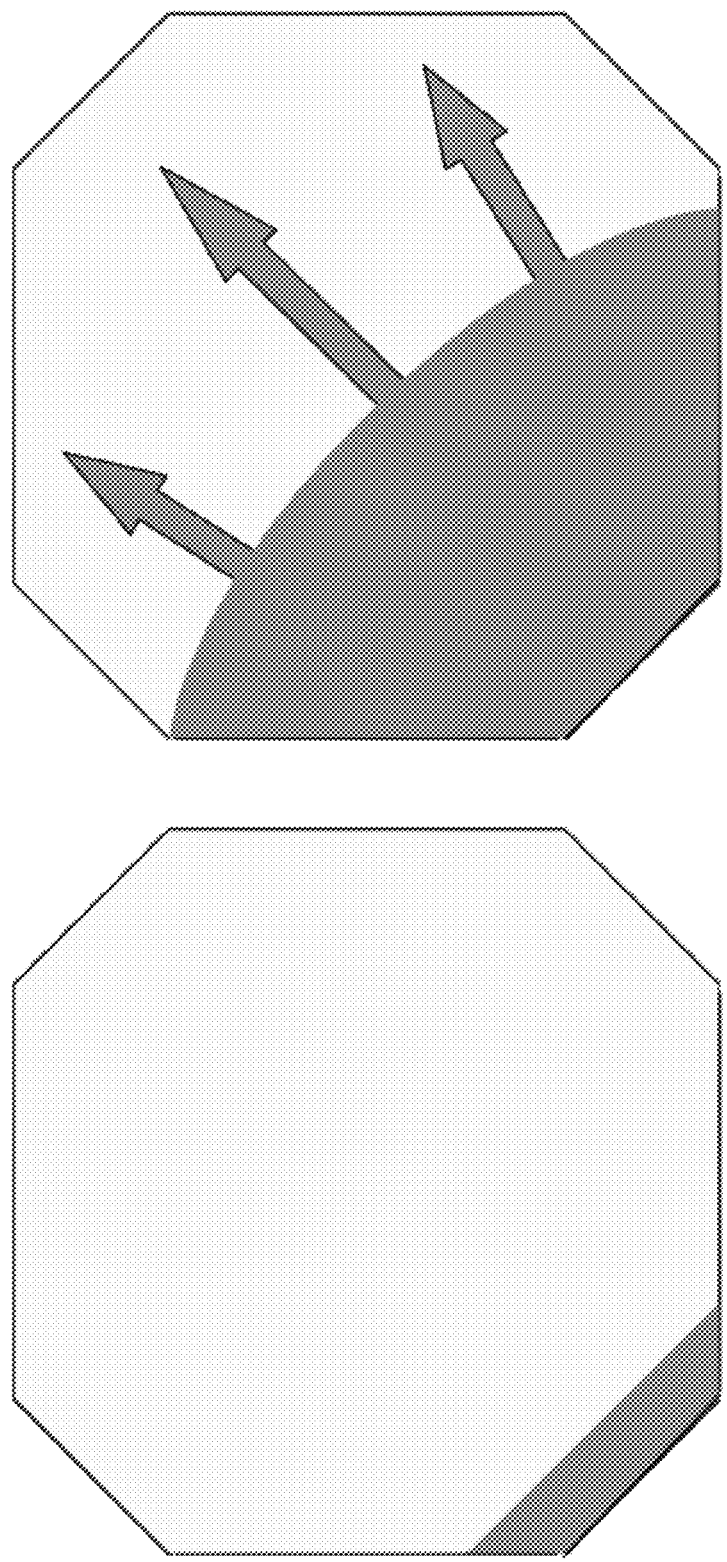
FIG. 15 shows controlled propagation in a two step sequence on a pseudo-square tile.

Once the cleave plane is developed, the tray is moved to a cleaving subsystem that uses a 2-step initiation-propagation sequence to cleave the wafer from each tile. A small ($mm^2$ to $cm^2$) area has a higher dose that is thermally pulse treated to initiate a starting crack. This crack occurs at an edge area of the cleave plane and is designed to avoid generating cleave artifacts. A second scanning energy source is used to propagate the cleave front from this small initiation area through the tile to fully detach the film. FIG. 15 shows the initiation-propagation cleaving sequence using a corner initiation area. A technology in achieving high throughput is the development and use of advanced controlled propagation to limit the cleave plane dose requirement. The mechanical configuration is challenging since, as opposed to bonded layer-transfer configurations using double cantilever beam geometries, thin-film release on a thick tile donor can generate substantial in-plane shear stress intensity components ($K_{II}$). External energy can be used to control the propagation and keep the film from branching out of the cleave plane. Although all major crystal orientations have been experimentally verified, (111) orientation may be the preferred material for DFT use due to its lower surface energy.

Figure 16:
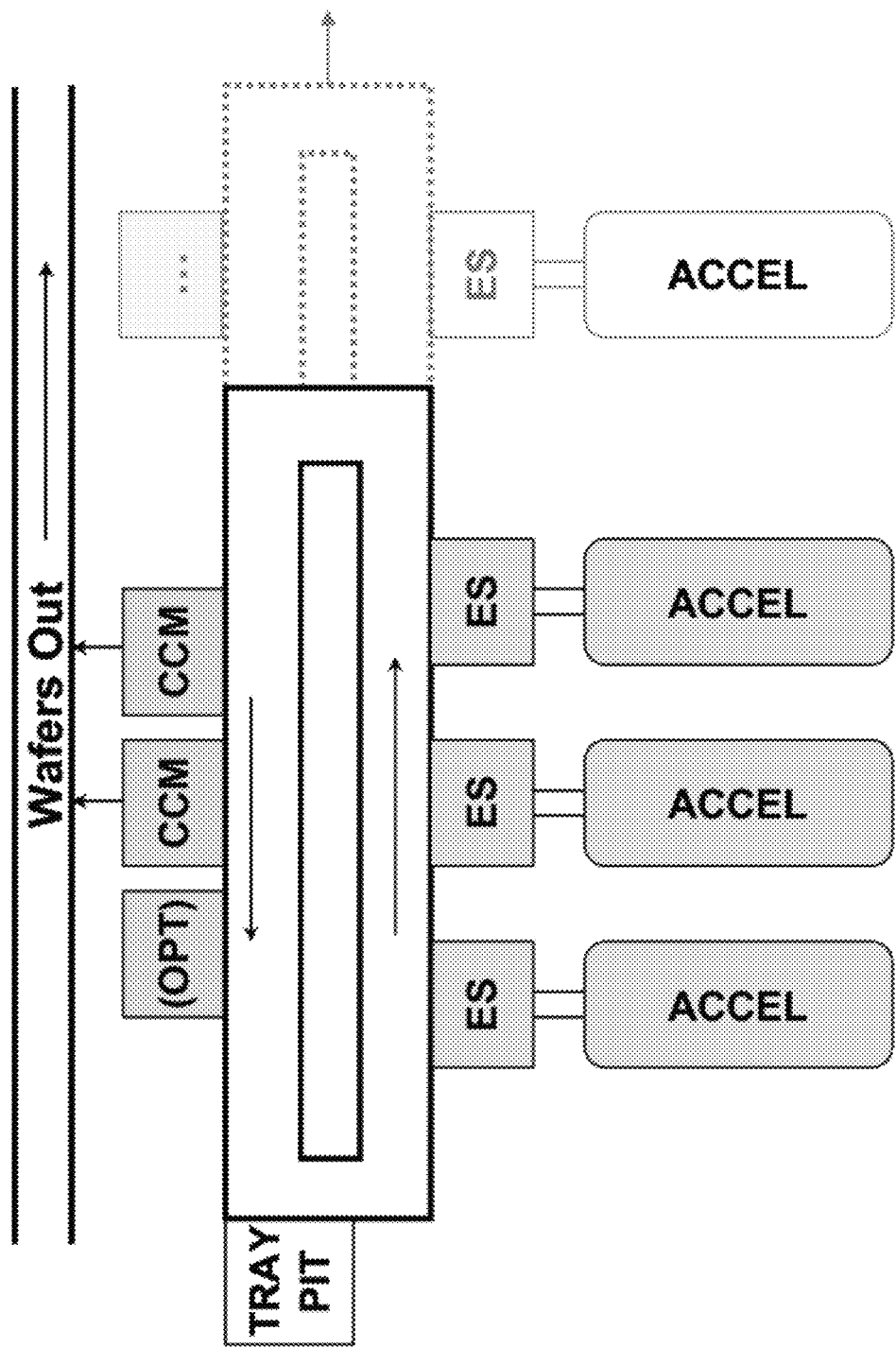
FIG. 16 shows an example of a production system factory layout.

FIG. 16 shows the equipment concept with the accelerator/end-station implant (Accel-ES) and controlled-cleave module (CCM) making up the 2-step wafering process within a factory environment.

Figure 17:
FIG. 17 shows a 50 um thick 125 mm wafer.

The mechanical, electrical and functional characteristics of PolyMax™ wafered silicon were evaluated. The DFT process has been experimentally used to produce films spanning from thin-film to free-standing wafer substrates. Large-area CZ silicon films of 17 μm, 50 μm, and 120 μm thickness have been produced. One example is a 50 μm, 125 mm pseudo-square wafer as shown in FIG. 17. A 50-150 μm wafering range is planned for the first PolyMax™ equipment set.

Preliminary data regarding surface roughness, TTV, edge, and mechanical strength using this technology are very promising.

Figure 18:
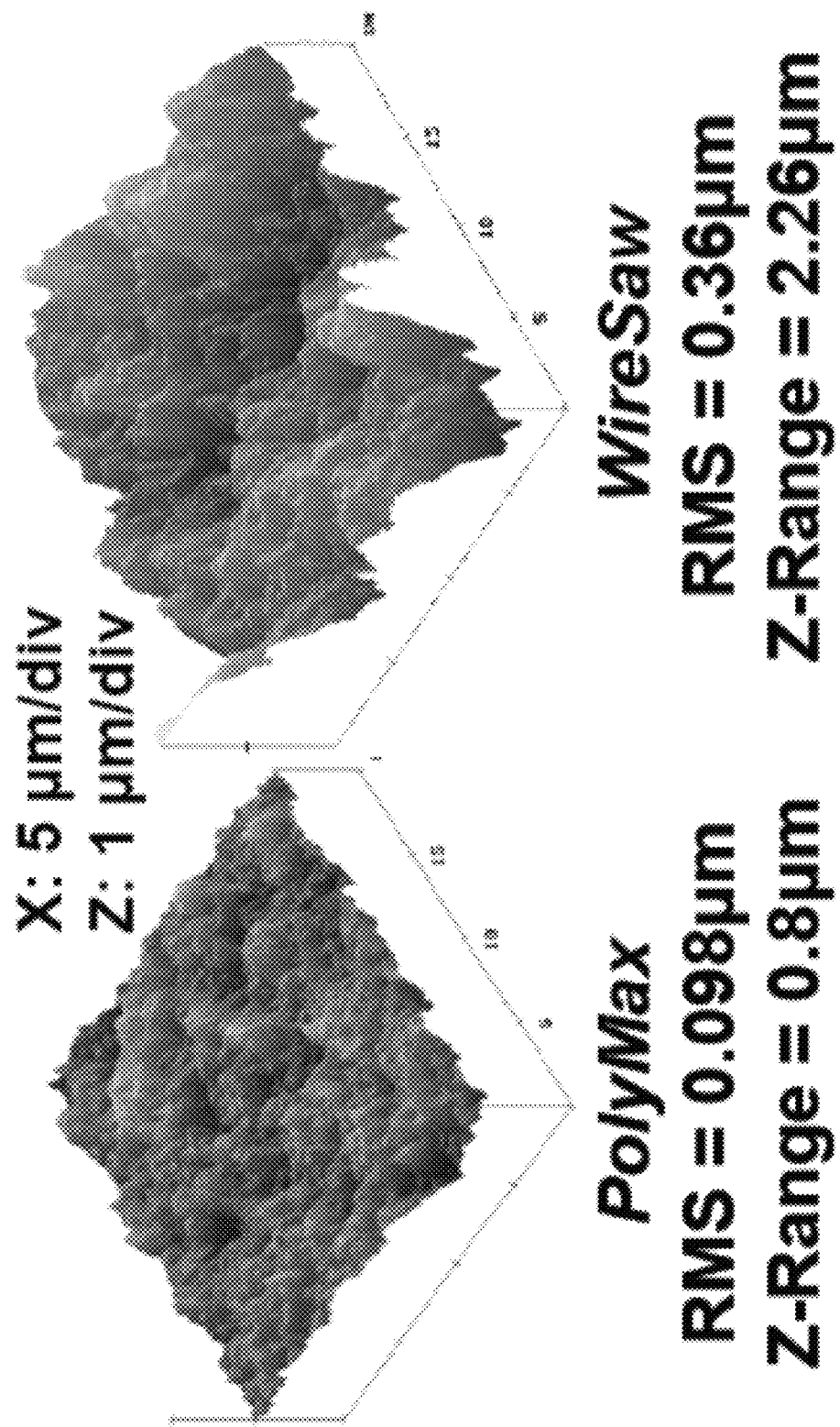
FIG. 18 shows AFM surface roughness comparison for a wafer formed according to an embodiment of the present invention, versus a wafer formed by conventional wiresaw process.

Roughness of the cleaved film is generally much less than 1 μm and proportional to cleave thickness. FIG. 18 shows AFM of a 50 μm PolyMax™ film compared to a 240 μm wiresaw reference wafer. The excellent surface roughness of the process is apparent.

Figure 18A:
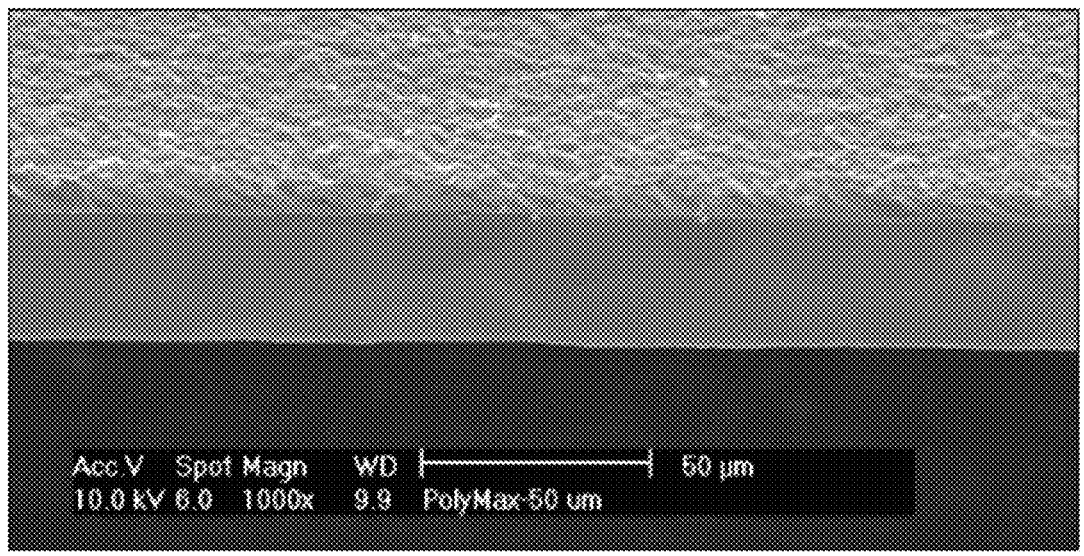
FIGS. 18A-B are cross-sectional SEMs showing surface roughness for a wafer formed according to an embodiment of the present invention, versus a wafer formed by conventional wiresaw process.
Figure 18B:
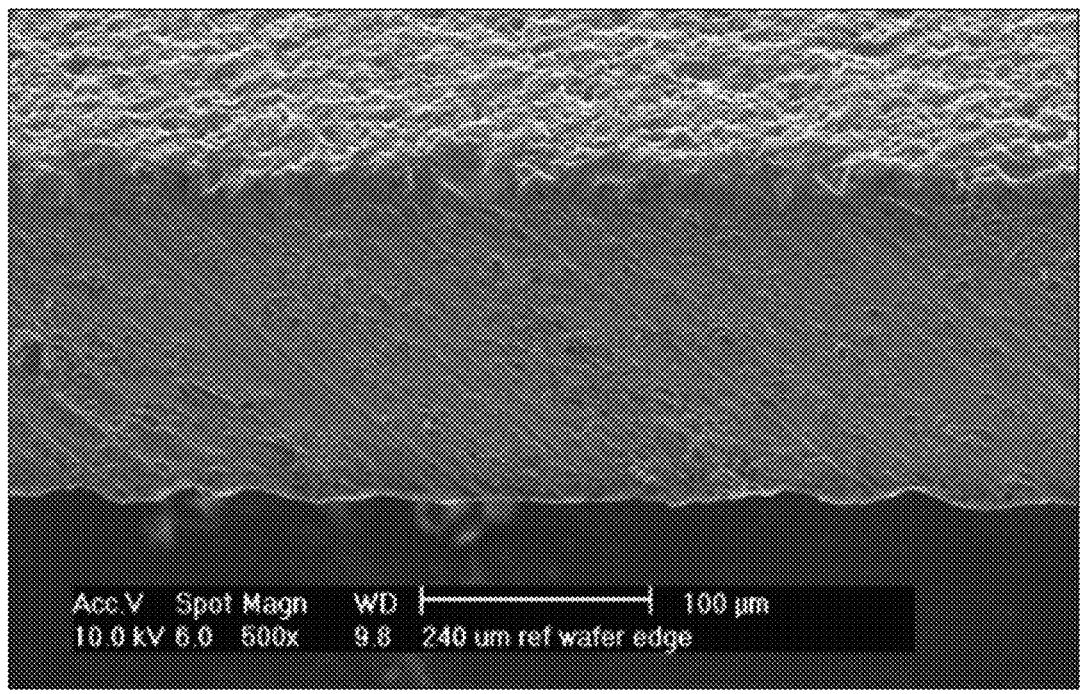
Figure 18C:
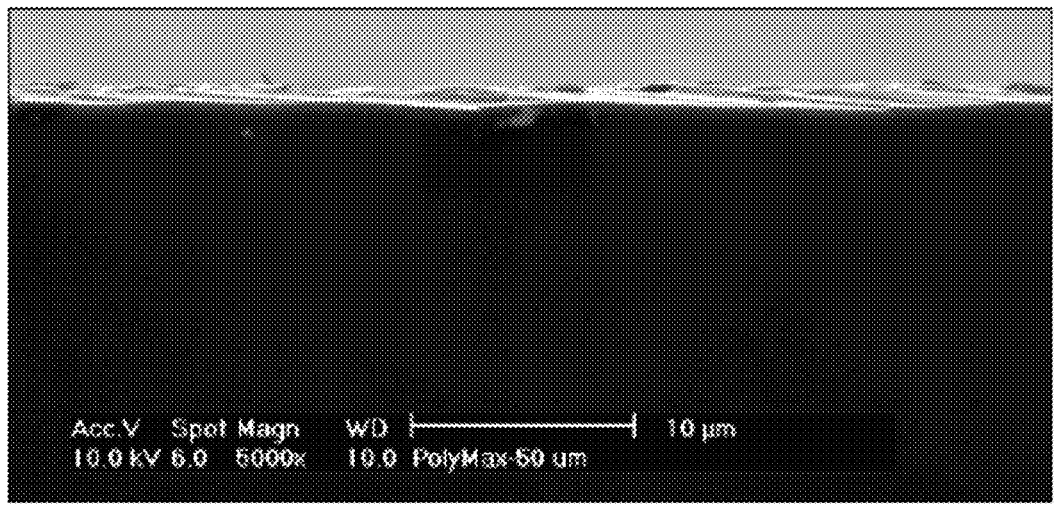
FIGS. 18C-D are cross-sectional SEMs showing wafer edge profile for a wafer formed according to an embodiment of the present invention, versus a wafer formed by conventional wiresaw process.
Figure 18D:
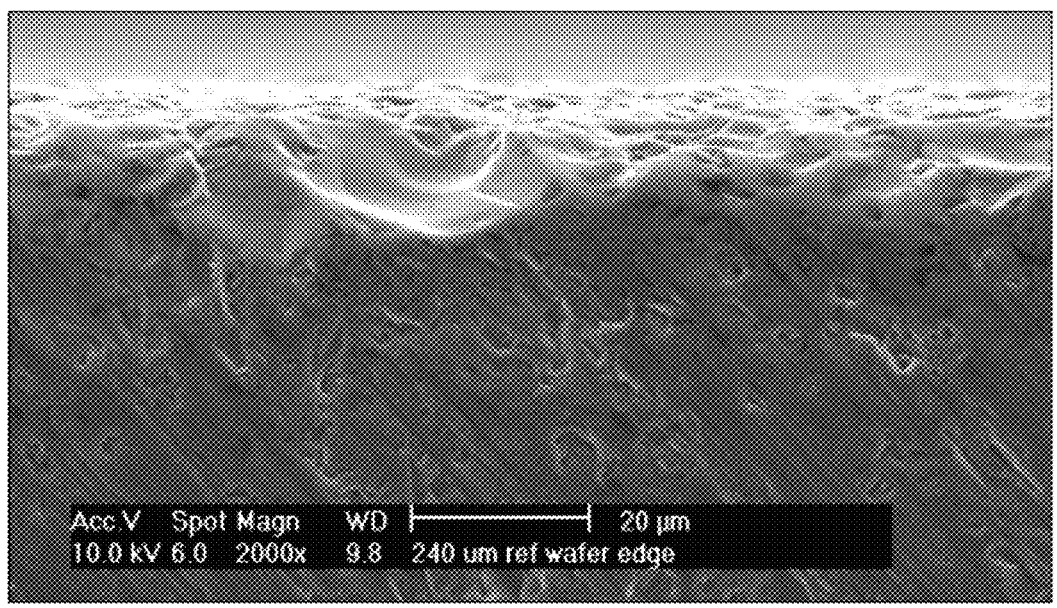
Figure 19:
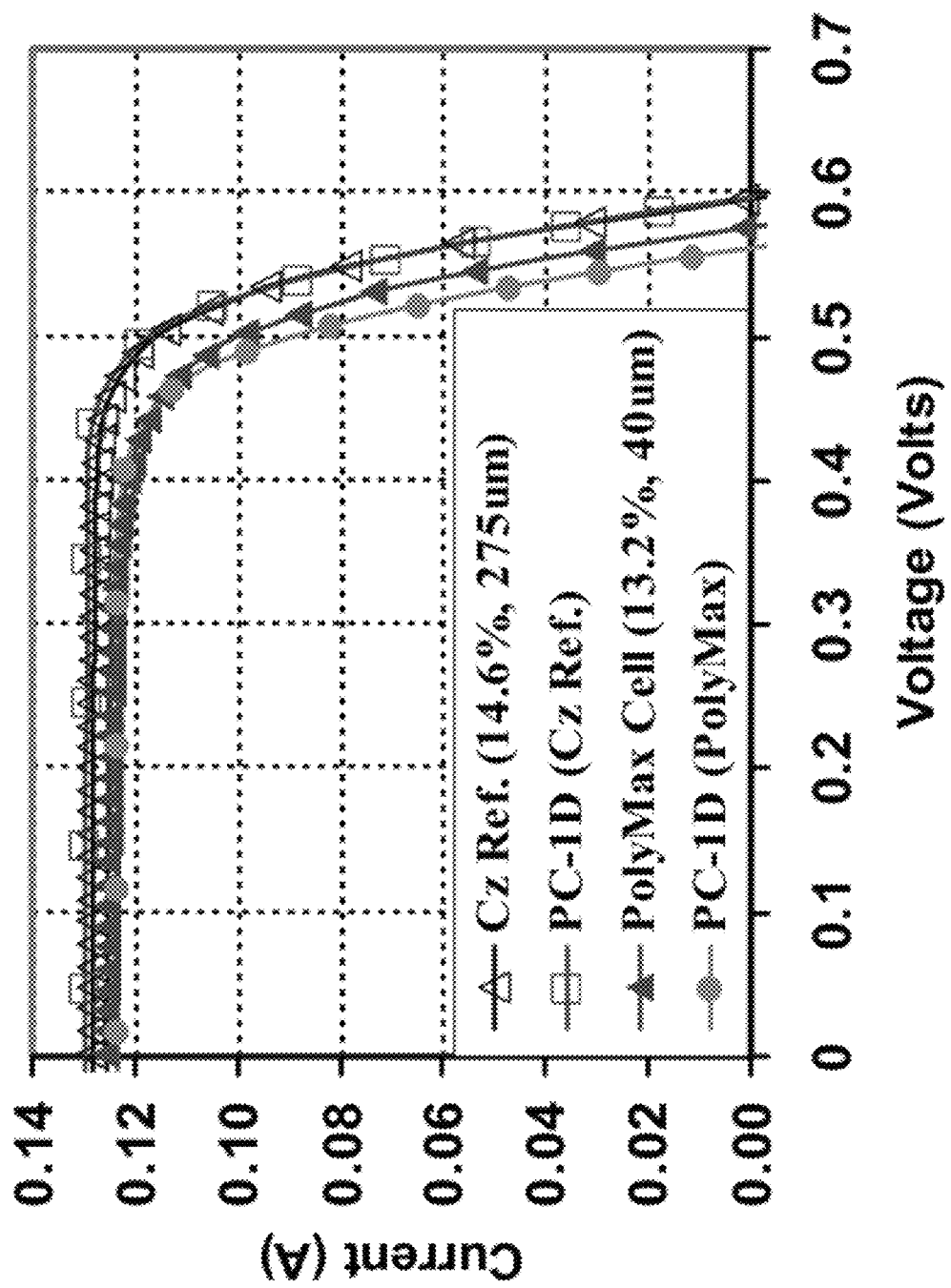
FIG. 19 plots current versus voltage for different wafers.

Total Thickness Variation (TTV) is less than 1-2% and SEM microphotographs show excellent edge quality (FIGS. 18A-B). The comparison of PolyMax™ side and edge profiles to conventional wiresaw processed wafers demonstrates its substantially better dimensional control and edge quality. It is interesting to note that assuming 160 μm kerf loss for the wiresawed wafer, the total wiresaw wafer pitch is 400 μm versus 50 μm for the PolyMax™ wafer, making it fully 8× more efficient in polysilicon feedstock use.

One unexpected benefit from the DFT process sequence was the measurement of surprisingly high mechanical strength of the resulting wafers. This is believed to be a result of the lower defect generation rate of the implant-cleave slicing method.

Table I shows the results of ring-on-ring stress to fracture mechanical tests on 50 μm PolyMax™ samples compared to 240 μm using ring-on-ring.

TABLE I

Stress-to-fracture mechanical strength test
(Ring-on-Ring, 9 mm/4 mm ring sizes, 10.5
mm square samples diced from 125 mm wafers)

|  | As-Sliced | Post-Etched (Δ~14 μm) |
|---|---|---|
| PolyMax ™ 50 μm | 1500 MPa | 2400 MPa |
| 240 μm Wiresaw Reference | 98 MPa | 310 MPa |

An etch of 7 μm per side improved surface stress to breakage from an already impressive 1.5 GPa to 2.4 GPa. Interestingly, many (111) triangular samples showed fracture stress over 10 and even 20 GPa. In contrast, the wiresaw reference samples consistently yielded substantially lower strength due to crack injection during the sawing process. For example, see K. Wasmer & al., Effect of Strength Test Methods on Silicon Wafer Strength Measurements, Proceeding of the 22rd European Photovoltaic Solar Energy Conference, paper 2CV.3.20 (2007); and A. Bidiville & al., Towards the Correlation of Mechanical Properties and Sawing Parameters of Silicon Wafers, Proceeding of the 22rd European Photovoltaic Solar Energy Conference, paper 2CV.3.19 (2007), both of which are incorporated by reference herein for all purposes. FIGS. 18A-B SEM microphotographs show the cleaner and less defective process result.

The process has also been verified to be capable of repeatedly detaching films from a tile without surface preparation between successive detachments. The films continue to have similar roughness and TTV without any interim polishing or other surface modification steps. This suggests that the process can be scaled to high-volume, low-cost manufacturing with minimal surface reconditioning.

Lifetime recovery and measurement of certain embodiments is now described. Minority carrier lifetime degradation by high-energy proton irradiation is a well known and researched phenomenon due to the importance of solar cells in space applications. For example, see M. Yamaguchi & al., High-energy and high-fluence proton irradiation effects in silicon solar cells, J. Appl. Phys. 80 (9), 4916 (1996), and A. Hallen & al., Lifetime in proton irradiated silicon, J. Appl. Phys. 79 (8), 3906 (1996), both of which are incorporated by reference herein for all purposes. A main element of developing the DFT process was therefore linked to demonstrating minority carrier lifetime recovery. Effects such as contaminant co-implantation are also of concern but careful implant system design can mitigate this issue.

A radiation damage production and annihilation model was developed and showed that specific DFT implant process sequences could eliminate extended defect production. Using implant temperature control to limit radiation damage density and recognizing that only the End-of-Range layer must be removed as a damage layer, a post-cleave "etch/anneal recovery" was found to work well in recovering high bulk minority carrier lifetime. It was found that using these sequences, most of the lifetime degradation were limited to divacancy (V-V) radiation damage production that can be readily corrected using post-cleave annealing. Normal cell processing would be more than sufficient to develop the lifetime anneal required and thus the step is considered an inherent part of the cell process. The End-of-Range layer etch can be done at the "saw damage etch" step within the solar cell process.

PolyMax™ wafers can thus be fully lifetime recovered simply by running the wafer through a normal cell process sequence that includes a surface etch and an anneal/drive-in.

Minority carrier lifetime on 50 μm PolyMax™ wafers were measured by a photoconductance tester and shows over 300 μsec at MCD 1E+15 cm$^{-3}$ lifetime using a single-step etch/anneal recovery process. Table II also shows how lifetime improves with increasing surface etch. A 50 μm polished CZ reference wafer was also measured.

TABLE II

Sinton Consulting WCT-120 effective lifetime measurements of
PolyMax ™ wafers with "etch/anneal recovery".

|  | Thickness (μm) | Lifetime (μsec) * (MCD = 1 × 10$^{15}$ cm$^{-3}$) |
|---|---|---|
| As-Cleaved | 47 | <10 |
| Etch #1 | 39 | 100 |
| Etch #2 | 37 | 160 |
| Single-Step Recovery | 35 | 350 |
| Polished CZ Reference | 50 | 250 |

Anneal was a single 850C/3 minute treatment.
Note that these measurements are uncorrected for surface recombination velocity. As a result, the bulk lifetime may be substantially higher than reported.

Photovoltaic cell fabrication and measurement is now described. To show end product functionality, PV test cells were made in collaboration with Georgia Institute of Technology's Center of Excellence for Photovoltaics. A slightly modified cell process was used to fabricate 4 cm2 PV cells on p-type 50 µm, 6 Ω-cm PolyMaX™ and 275 µm, 3 Ω-cm CZ reference wafers. Both had lifetime of at least 100 µsec. The cells were made using a ~78 nm silicon nitride coated frontside with an n+0.5-1 µm thick, 35 ohm/□ emitter. The back surface was a CVD deposited Al film ~1 µm thick. The process was not optimized for the thin substrates but showed basic functionality.

FIG. 8 shows the I-V curves of 4 cm$^2$ cells yielding 13.2% and 14.6% conversion efficiency respectively. The efficiency difference was bridged between the reference and the PolyMaX™ cell by using PC-1D and changing only resistivity and thickness. The 1.4% efficiency difference can therefore be fully accounted by the PolyMax™ material's higher resistivity and 40 µm thickness. Use of texturization on a more advanced cell design is in planning.

Equipment throughput and efficiency for an embodiment of the process is now described. An equipment set is currently under design to perform the PolyMax™ process in high-volume manufacturing. The equipment is expected to produce about 5-7 MW equivalent of wafers per year with an energy cost of about 0.6 kW-hr/Wp produced (150 µm wafer thickness). This compares favorably with multi-wire slurry saw (MWSS) systems if the slurry and satellite systems such as washing/drying and singulation systems are included. If the kerf-loss savings are also included, the system can become a net energy saving step over the incumbent sawing method.

In conclusion, a novel kerf-free, dry wafering process has been introduced and described. The process uses a 2-step implant-cleave method where high-energy light ion irradiation first forms a cleave plane followed by advanced controlled cleaving to initiate and controllably propagate a fracture plane along the cleave plane to release a large-area wafer from a shaped boule.

The process has been used to produce test samples to show material quality, characteristics and demonstrate scaling to high-volume manufacturing. Surface roughness, edge quality, mechanical strength, lifetime and test cell efficiency results confirm the viability of the method as a PV wafering technology with excellent conversion efficiency with low polysilicon feedstock use.

The economic impact and applicability of a practical kerf-free PV wafering process with high material quality is substantial. The process can be used to fabricate free-standing substrates of 50 cm to 150 µm for substitutive and advanced wafer PV manufacturing. The process also shows potential to make high-quality ultra-thin films of 20-50 µm thickness.

This wide thickness range allows the process to participate in both the "thin" and "thick" silicon PV markets. For thick "free-standing" substrate manufacturing processes, the process allows less expensive absorber at equivalent efficiencies. For thin absorbers, the ability of the process to generate 20-50 µm thick high-efficiency silicon absorber films, possibly mounted onto large mechanical backing material satisfies a novel form factor that has been challenging for the industry to achieve. The technology can ultimately offer a high lifetime and efficiency alternative to current thin-film technologies.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Therefore, the above description and illustrations should not be taken as limiting the scope of the present invention which is defined by the appended claims.

What is claimed is:

1. A method of fabricating a thickness of silicon material, the method comprising:
   providing a silicon ingot material having a surface region;
   introducing a plurality of particles having an energy of about 1-5 MeV and greater through the surface region to a depth to define a cleave region and a thickness of detachable material between the cleave region and the surface region;
   processing the silicon ingot material to free the thickness of detachable material at a vicinity of the cleave region;
   causing formation of a free-standing thickness of material characterized by a carrier lifetime of about 10 microseconds and less, a first thickness ranging from about 20 microns to about 150 microns with a total thickness variation of less than about five percent;
   treating the free-standing thickness of material using at least an etching process; and
   performing a thermal/passivation process on the free-standing thickness of material to recover the carrier lifetime to greater than about 200 microseconds.

2. The method of claim 1 wherein the free-standing thickness of material after the etching process is substantially free from surface damage.

3. The method of claim 1 wherein the free-standing thickness of material after the thermal treatment process is substantially free from sub-surface damage.

4. The method of claim 1 wherein the etching process removes about 5-10% of the thickness of material from a front surface of the free-standing thickness of material and from a back surface of the free-standing thickness of material to have a second thickness ranging from about 16 microns to about 120 microns.

5. The method of claim 4 wherein the free-standing thickness of material after the etching process retains the thickness variation substantially the same as that before the etching process.

6. The method of claim 4 wherein the etching process leads to a RMS surface roughness between about 100-300 nm.

7. The method of claim 4 wherein the etching process develops a texture on either the front surface or the back surface characterized by higher light trapping capability.

8. The method of claim 1 wherein the thermal/passivation process is characterized by a temperature of about 400 Degrees Celsius to about 800 Degrees Celsius and usage of iodine/methanol solution.

9. The method of claim 1 wherein the free-standing thickness of material is characterized by a strength of about 1 to 5 GPa fracture stress as measured by a ring on ring.

10. The method of claim 1 wherein the etching process comprises dipping the free-standing thickness of material into a solution of HF, nitric and acetic acid for a predetermined time and with a predetermined speed.

11. A method of fabricating a thickness of silicon material having a total thickness variation of less than about 5% (change in thickness/thickness), the method comprising:
    providing a silicon ingot material having a surface region;
    introducing a plurality of particles having an energy of about 1-5 MeV through the surface region to a depth to define a cleave region and a thickness of detachable material between the cleave region and the surface region;

processing the silicon ingot material to free the thickness of detachable material at a vicinity of the cleave region;

causing formation of a free-standing thickness of material characterized by a carrier lifetime of about 10 microseconds and less, a first thickness substantially equal to that of the thickness of detachable material;

treating the free-standing thickness of material using at least an etching process;

performing a thermal/passivation process on the free-standing thickness of material to recover the carrier lifetime to greater than about 200 microseconds; and wherein the free-standing thickness of material has a strength about 1 GPa and greater in fracture stress.

12. The method of claim 11 wherein the free-standing thickness of material after the etching process is substantially free from surface damage.

13. The method of claim 11 wherein the free-standing thickness of material after the thermal treatment process is substantially free from sub-surface damage.

14. The method of claim 11 wherein the etching process removes about 5-10% of the first thickness of the free-standing thickness of material to provide a second thickness with a total thickness variation.

15. The method of claim 14 wherein
the first thickness ranges from about 20 microns to about 150 microns;
the second thickness ranges from about 16 microns to about 120 micron;
the total thickness variation is less than 5%.

16. The method of claim 15 wherein the etching process leads to a RMS surface roughness of about 1000 nm and less as measured by atomic force microcsopy (AFM).

17. The method of claim 11 wherein the thermal/passivation process is characterized by an annealing temperature of about 400 Degrees Celsius to about 800 Degrees Celsius and usage of iodine/methanol solution.

18. The method of claim 11 wherein the free-standing thickness of material is characterized by a strength of about 1 GPa and greater in fracture stress as measured by a ring-on-ring test.

19. The method of claim 11 wherein the free-standing thickness of material is characterized by a strength of about 5 GPa and greater in fracture stress as measured by a ring-on-ring test.

20. The method of claim 11 wherein the silicon ingot is P type characterized by a resistivity of about 0.2 to 12 Ohm centimeter.

21. The method of claim 11 wherein the etching process comprises dipping the free-standing thickness of material in a solution of HF, nitric and acetic acid.

* * * * *